US006539106B1

(12) United States Patent
Gallarda et al.

(10) Patent No.: US 6,539,106 B1
(45) Date of Patent: Mar. 25, 2003

(54) FEATURE-BASED DEFECT DETECTION

(75) Inventors: Harry S. Gallarda, Mountain View, CA (US); Chiwoei Wayne Lo, Campbell, CA (US); Adam Rhoads, San Ramon, CA (US); Christopher G. Talbot, Emerald Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/227,747

(22) Filed: Jan. 8, 1999

(51) Int. Cl.[7] .................................................. G06K 9/46
(52) U.S. Cl. ...................................... 382/149; 382/286
(58) Field of Search ................................. 382/144–151, 382/173, 204, 205, 264, 219, 274, 275; 348/87, 126; 356/237.4, 237.5; 250/492.3, 492.2, 559.45; 438/16, 17; 700/110, 121; 702/82, 172

(56) References Cited

U.S. PATENT DOCUMENTS

| 5,301,248 | A | * | 4/1994 | Takanori et al. ................ 382/8 |
| 5,401,972 | A |   | 3/1995 | Talbot et al. ............. 250/491.1 |
| 5,455,870 | A | * | 10/1995 | Sepai et al. .................. 382/147 |
| 5,493,116 | A |   | 2/1996 | Toro-Lira et al. ............ 250/310 |
| 5,495,535 | A | * | 2/1996 | Smiansky et al. ........... 382/145 |
| 5,502,306 | A |   | 3/1996 | Meisburger et al. ........ 250/310 |
| 5,578,821 | A |   | 11/1996 | Meisberger et al. ........ 250/310 |
| 6,072,897 | A | * | 6/2000 | Greenberg et al. ............. 82/144 |
| 6,122,397 | A | * | 9/2000 | Lee et al. .................... 382/148 |
| 6,122,398 | A | * | 9/2000 | Yokomae et al. ............ 382/152 |
| 6,225,815 | B1 | * | 5/2001 | Nakamura .................. 324/751 |
| 6,169,816 | B1 | * | 1/2002 | Ravkin ....................... 382/128 |

OTHER PUBLICATIONS

Aton, T.J. et al., "Testing Integrated Circuit Microstructures Using Charging–Induced Voltage Contrast", J. Vac. Sci. Technol. B, vol. 8, No. 6, Nov./Dec. 1990, pp. 2041–2044.

Cass, Thomas R., "Use Of The Voltage Contrast Effect For The Automatic Detection Of Electrical Defects On In–Process Wafers", Technology Development Center, ICBD, Hewlett–Packard Co., pp. 506–1–506–11.

Goto, Eiichi et al., "MOL (moving objective lens) Formulation of Deflective Aberation Free System", Optik, vol. 48, No. 3 (1977), pp. 255–270.

Jenkins, Keith A. et al., "Analysis Of Silicide Process Defects By Non–Contact Electron–Beam Charging", IEEE Electron Devices Society and IEEE Reliability Society 30th Annual Proceedings, 1992, (IEEE Catalog No. 92CH3084–1), pp. 304–308.

Munro, E. "Design And Optimization Of Magnetic Lenses And Deflection Systems For Electron Beams", J. Vac. Sci. Technol., vol. 12, No. 6, Nov./Dec. 1975, pp. 1146–1150.

(List continued on next page.)

Primary Examiner—Brian Werner
(74) Attorney, Agent, or Firm—Michael B. Einschlag

(57) ABSTRACT

Methods and apparatus are provided for inspecting a patterned substrate, comprising: preparing a reference image and a test image, extracting features from the reference image and extracting features from the test image, matching features of the reference image and features of the test image; and comparing features of the reference image and of the test image to identify defects. Embodiments include apparatus for inspecting patterned substrates, computer-readable media containing instructions for controlling a system having a processor for inspecting patterned substrates, and computer program products comprising a computer usable media having computer-readable program code embodied therein for controlling a system for inspecting patterned substrates. The images can be electron-beam voltage-contrast images.

25 Claims, 21 Drawing Sheets

OTHER PUBLICATIONS

Pfeiffer, Hans C., "Recent Advances In Electron–Beam Litography For The High–Volume Production Of VLSI Devices", IEEE Transactions on Electron Devices, vol. ED–26, No. 4, Apr. 1979, pp. 663–674.

Pfeiffer, H.C. et al., "Advanced Deflection Concept For Large Area, High Resolution E–Beam Lithography", J. Vac. Sci. Technol., vol. 19, No. 4, Nov./Dec. 1981, pp. 1058–1063.

Saitou, Norio et al., "Variably Shaped Electron Beam Litography System, EB55: II Electron Optics", J. Vac. Sci. Technol., vol. 19, No. 4, Nov./Dec. 1981, pp. 1087–1093.

Thomson, M.G.R., "The Electrostatic Moving Objective Lens And Optimized Deflection Systems For Microcolumns", J. Vac. Sci. Technol. B, vol. 14, No. 6, Nov./Dec. 1996 pp. 3802–3807.

Thong, John T.L., "Electron Beam Testing Technology", Microdevices Physics and Fabrication Technologies, pp. 41–62.

* cited by examiner

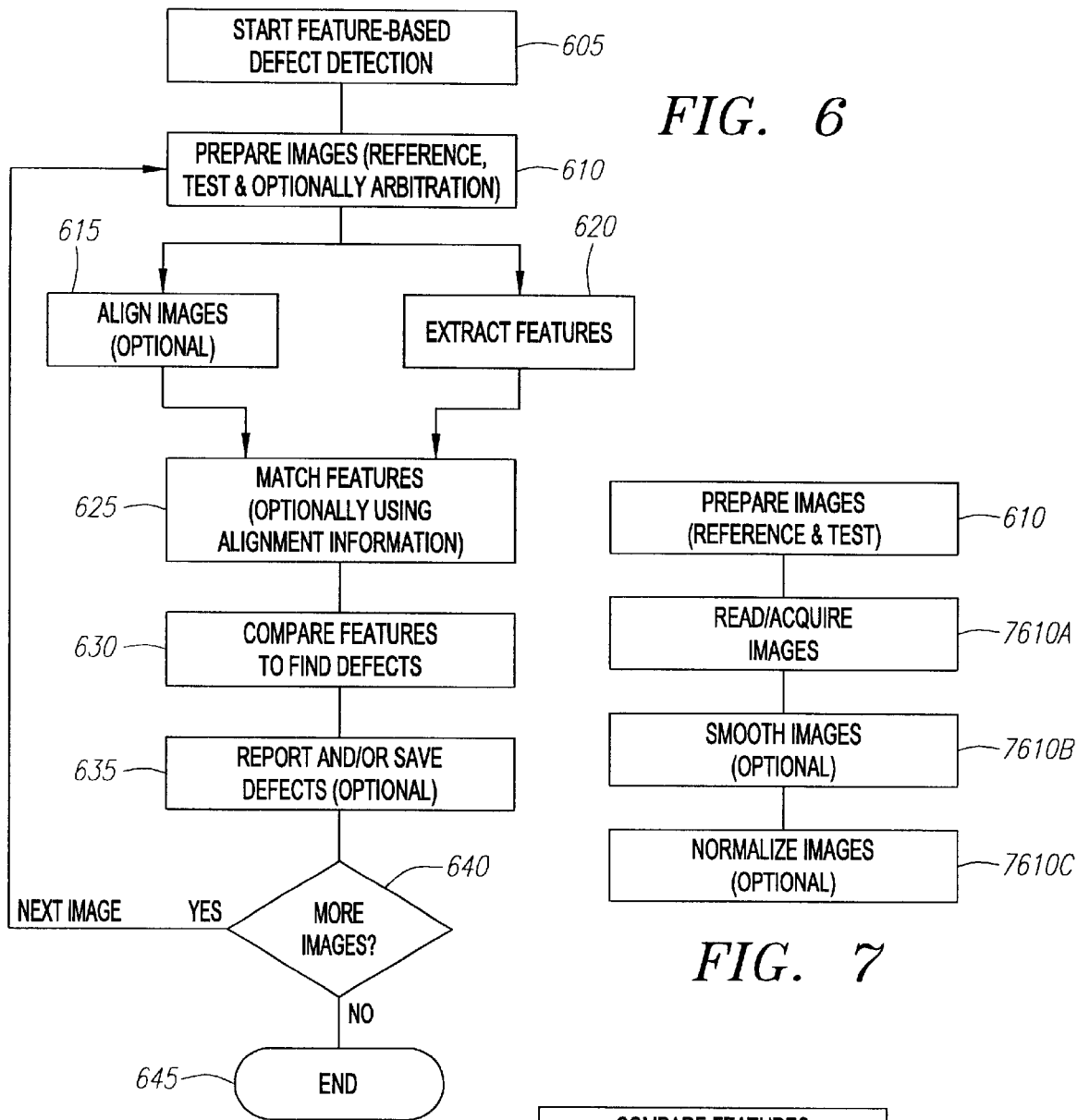
FIG. 6
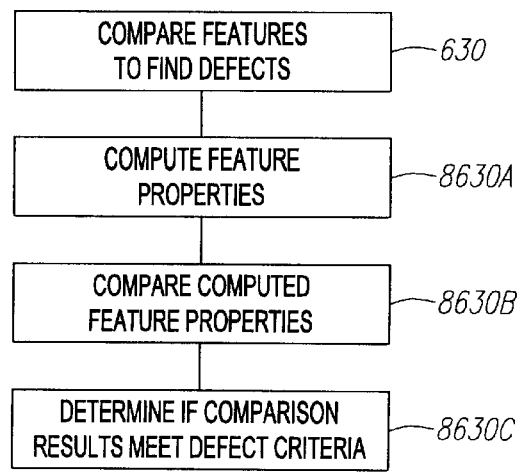
FIG. 7
FIG. 8

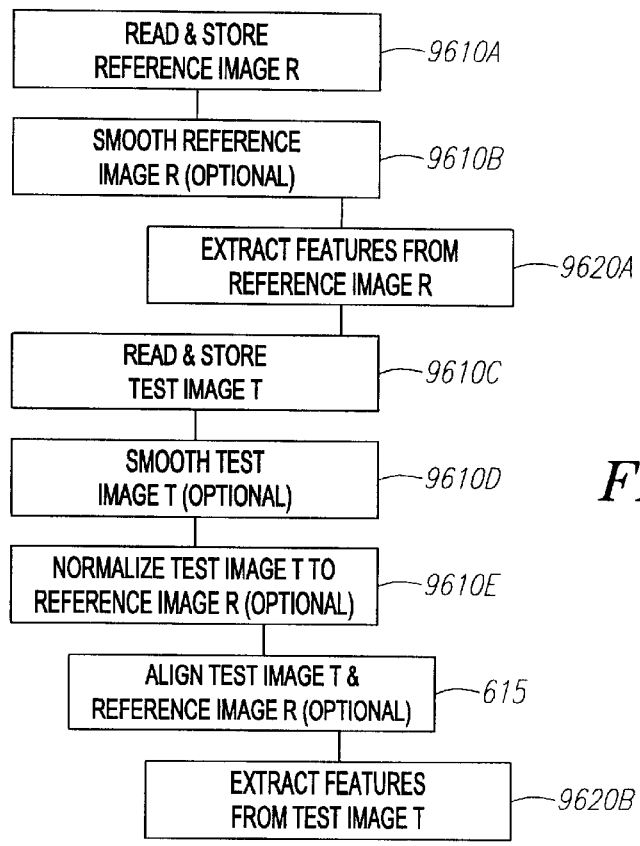
FIG. 9
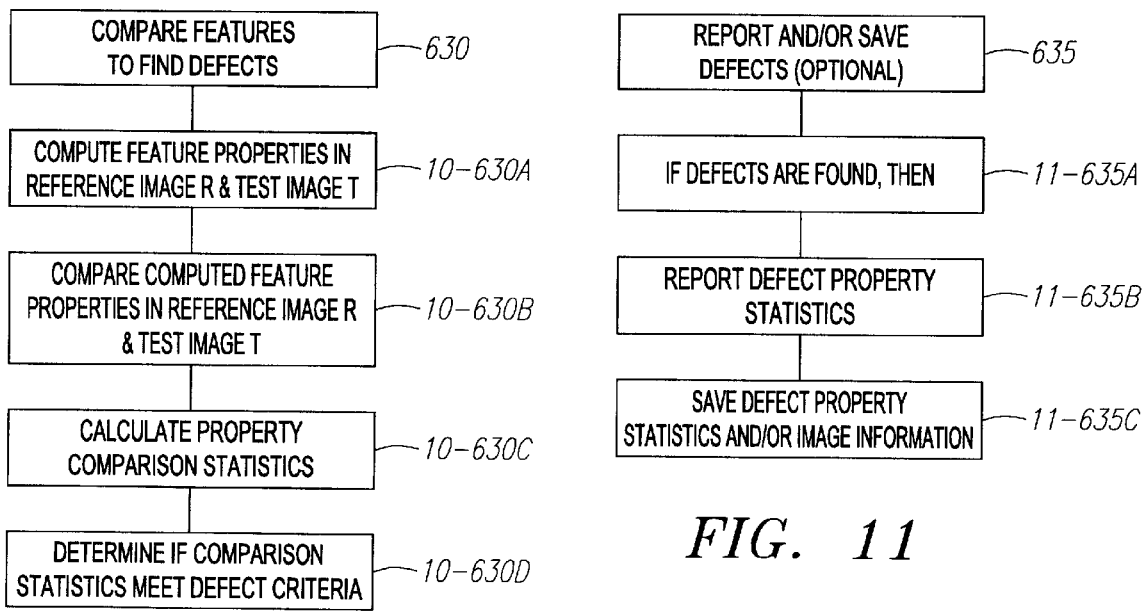
FIG. 10
FIG. 11

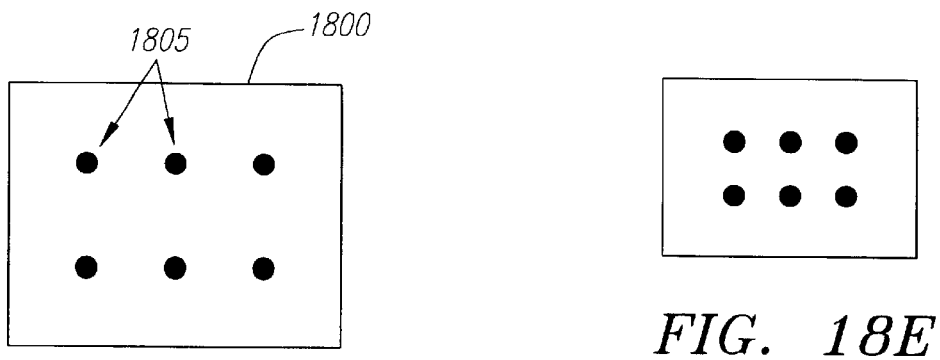
FIG. 18A
FIG. 18E
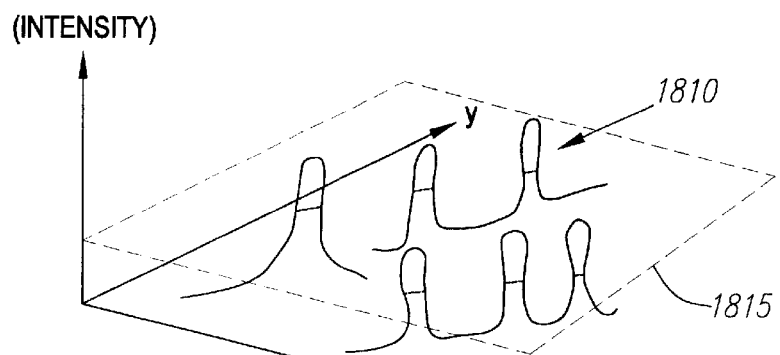
FIG. 18B
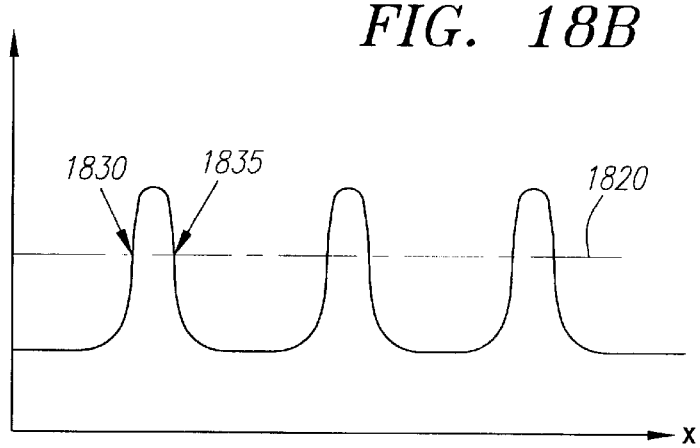
FIG. 18C
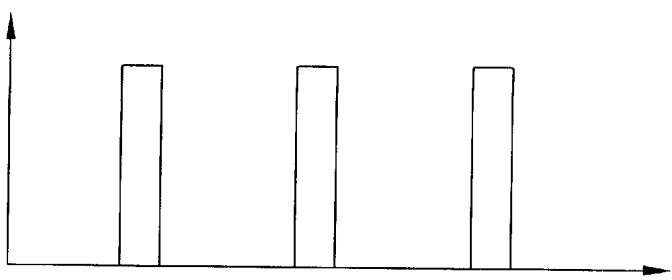
FIG. 18D

```
 T1  T2  T3
 O   O   O

O   O   O
 T4  T5  T6
```

| ID# | X,Y | A | I | .... |
|-----|-----|-----|-----|------|
| $T_1$ | $x_1 y_1$ | $a_1$ | $i_1$ | |
| $T_2$ | $x_2 y_2$ | $a_2$ | $i_2$ | |
| $T_3$ | $x_3 y_3$ | $a_3$ | $i_3$ | |
| ⋮ | ⋮ | ⋮ | ⋮ | |

FEATURE-BASED DEFECT DETECTION

RELATED PATENT APPLICATIONS

This application is related to co-pending U.S. patent application Ser. No. 08/892,734 filed Jul. 15, 1997, U.S. patent application Ser. No. 08/782,740 filed Jan. 13, 1997, U.S. patent application Ser. No. 09/012,227 filed Jan. 23, 1998, U.S. patent application Ser. No. 09/226,962 filed on the same date as this application and U.S. patent application Ser. No. 09/226,967 filed on the same date as this application, the contents of which are incorporated herein by reference.

COMPUTER PROGRAM LISTING APPENDIX

This disclosure incorporates by reference a computer program listing appendix on compact disk and having 1 disk and one duplicate disk and each disk having the following files: M-7229-1, having Appendices A to G; the assignee of this application reserves all copyright rights on the content of this computer program listing.

COPYRIGHT NOTICE

A portion of the disclosure of this patent document contains material which is subject to copyright protection. The copyright owner has no objection to the facsimile reproduction by any one of the patent disclosure, as it appears in the Patent and Trademark office patent files or records, but otherwise reserves all copyright rights whatsoever. 37 CFR §1.71.

BACKGROUND

1. Field of the Invention

The invention relates to the detection of defects in patterned substrates, such as semiconductor wafers, particularly based on features in voltage-contrast images.

2. The Prior Art

Manufacture of semiconductor devices involves many process steps resulting in patterns on a substrate. If the patterns of an intermediate stage of production are defective, they can result in defective die and, thus, low yields. Methods and apparatus for inspecting the patterns on semiconductor wafers at intermediate stages of production ("in-process") are known. These include systems and methods based on identification of pattern defects visible in optical images of the wafer. At least one approach is based on voltage-contrast images of the wafer acquired using a scanning electron beam, as described in U.S. Pat. Nos. 5,502,306 and 5,578,821 and implemented in the SEMSpec system offered commercially by KLA-Tencor Corp.

A prior method for detecting defects from voltage-contrast images is based on differencing of pixel-intensity values, pixel-by-pixel, between an image of the pattern to be inspected and a reference image. In this method, two voltage-contrast images, or two regions of one voltage-contrast image, are compared. To extract defects, the two images or image regions are first corrected for differences in brightness and contrast and aligned with one another. Then the difference of pixel-intensity values is taken, pixel-by-pixel, to produce a difference image. The resulting difference image is thresholded to produce a defect image in which the pixel values are binary. Features in the defect image meeting certain conditions, such as minimum size, shape, intensity, etc., are considered defects. Statistics of the defects in the images are then computed and reported. For example, the largest defect and total number of defects might be returned for each image. Then the images are reviewed based upon these statistics so that the most significant defects are processed and analyzed first, thereby reducing the review time considerably.

A strength of this method is that it requires little knowledge of electrical features or structures in the voltage-contrast images, only that they are of the same approximate size in both images or image regions and that alignment and image normalization will correct the overall differences in the images or image regions. This method allows voltage-contrast defects to be detected without first knowing what electrical patterns are being inspected.

But this strength is also a weakness: all image differences are considered potential defects even if they are not, so it is not possible to differentiate "killer" defects from "nuisance" defects or "false" defects. A "killer" defect is a defect of electrical significance in final test of a die, leading to reduced reliability or reduced electrical performance. A "false" defect is a report from a defect detection system of a defect which does not correspond to any surface or image artifact, resulting for example from an error by the defect system. A "nuisance" defect is a surface or image artifact which is real but is not a killer defect or otherwise of interest. Some artifacts of the inspection process are due to image misalignment, local image distortions and non-linearities of the scanning process used to acquire the voltage-contrast images. Since the occurrence of killer defects is in general quite rare, the number of nuisance defects detected can be much larger than the number of killer defects. In conventional, pixel-based inspection systems, 90% or more of the reported defects can be nuisance defects. Separating these from the killer defects requires time-consuming and costly human review and judgment. The high rate of nuisance defects and false defects and need for human intervention make it difficult to improve the performance of the inspection process to make it more useful in semiconductor wafer fabrication. Existing solutions to reduce the rate of nuisance defects and false defects caused by misalignment, such as precise wafer-stage positioning, more uniform and repeatable imaging, and improved defect-detection algorithms, do not eliminate the problem and typically reduce sensitivity to killer defects. At the same time, these solutions require more processing, and thus more processing time or more processing hardware. This limits throughput and the performance vs. price ratio.

Another drawback is that, since the method is pixel-based, it can only detect differences of intensity pixel-by-pixel. This makes detection of certain types of defects difficult if not impossible. Co-pending U.S. patent application Ser. No. 09/226,962 describes techniques for enhancing the visibility in a voltage-contrast image of electrically-significant defects in features such as unfilled contact holes. These techniques cause a change in the apparent size of the unfilled contact hole in the voltage-contrast image depending on electrical connectivity of material in the contact hole. While a pixel-based image-comparison method might detect the change in size as an intensity difference for pixels surrounding the contact hole, and pixel-intensity differencing might show a doughnut-shaped defect, it would not reveal the fundamental manifestation of this type of defect—an apparent change of size of the feature rather than a change of intensity.

FIG. 1 shows a prior method in which images are acquired and processed in parallel. The image acquisition portion begins with setup of a batch file at step 105, followed by image acquisition at step 110, storage of the image at step 115, and moving to a next image at step 120. Images are stored in a disk storage device 125. Steps 110, 115 and 120 are repeated for other regions of a wafer and, when imaging of the wafer is complete, imaging of another wafer begins. Once an image has been acquired, image processing proceeds in parallel with acquisition of further images. Image processing begins with alignment of the acquired image with a reference image at step 130, then the pixel-intensity levels of the images are differenced at step 135 to produce a difference image. Noise is reduced from the difference image at step 140, followed by counting of features in the difference image at step 145. Features in the difference image are sorted at step 150, and manually reviewed at step 155 to decide which of the features are to be considered defects.

Methods and apparatus are desired which will offer a lower rate of nuisance defects and less need for human intervention, and thus improved throughput and performance vs. cost.

SUMMARY

Methods and apparatus consistent with the invention employ feature-based image processing to detect, quantify and analyze defects in inspection of patterned substrates, such as semiconductor wafers, from voltage contrast e-beam images. A method of inspecting a patterned substrate comprises: preparing a reference image and a test image, extracting features from the reference image and extracting features from the test image, matching features of the reference image and features of the test image, and comparing features of the reference image and of the test image to identify defects. The images can be aligned before matching features. The reference image can be a voltage-contrast image of a first patterned substrate and the test image a voltage-contrast image of a second substrate, or the reference image can be a voltage-contrast image of a first region of a patterned substrate and the test image a voltage-contrast image of a second region of the same patterned substrate, or the reference image can be an image of repeating cells of a patterned substrate and the test image a duplicate of the reference image shifted by one cell relative to the reference image. The images can be pre-processed to reduce noise and/or artifacts such as by spatial smoothing, and/or normalizing. Comparing features of the images to identify defects can comprise computing feature properties (such as size, shape, average pixel intensity, center of gravity, diameter, area, standard deviation, etc.), comparing computed feature properties, and determining comparison results which meet predetermined defect criteria. Extracting features from an image can comprise enhancing the features (such as by computing an average background level of the image and removing the average background level from the image) to produce a first modified image, thresholding the first modified image to produce a second modified image, and identifying features in the second modified image. Alternatively, extracting features from an image can comprise matching a feature template in the image and identifying features in the image that match the feature-template.

Embodiments consistent with the invention include apparatus for inspecting patterned substrates, computer-readable media containing instructions for controlling a system having a processor for inspecting patterned substrates, and computer program products comprising a computer usable media having computer-readable program code embodied therein for controlling a system for inspecting patterned substrates.

These and other features of embodiments consistent with the invention will become apparent to those of skill in the art from the following description and the accompanying drawing figures.

BRIEF DESCRIPTION OF THE DRAWING

FIG. 6 is a flow chart showing methods consistent with the present invention;

FIG. 7 shows a more detailed embodiment of step 610 of FIG. 6 consistent with the present invention;

FIG. 8 shows a more detailed embodiment of step 630 of FIG. 6 consistent with the present invention;

FIG. 9 shows a more detailed embodiment of steps 610, 615 and 620 of FIG. 6 consistent with the present invention;

FIG. 10 shows a more detailed embodiment of step 630 of FIG. 6 consistent with the present invention;

FIG. 11 shows a more detailed embodiment of step 635 of FIG. 6 consistent with the present invention;

FIGS. 18A–18H illustrate feature extraction by thresholding in a manner consistent with the present invention;

DETAILED DESCRIPTION

Figure 1:
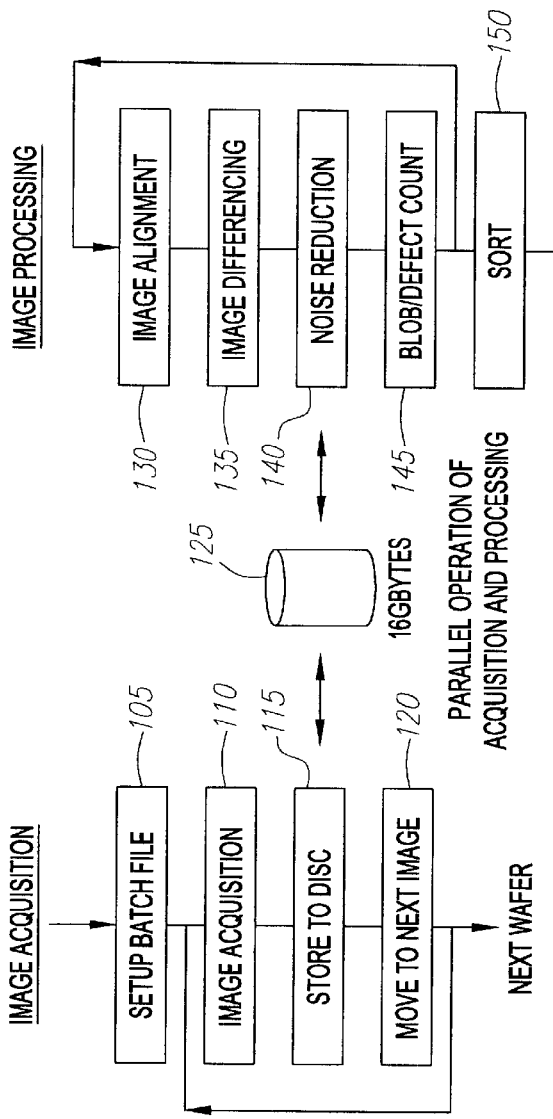
FIG. 1 is a flow chart of a prior method of image acquisition in parallel with image processing.
Figure 2:
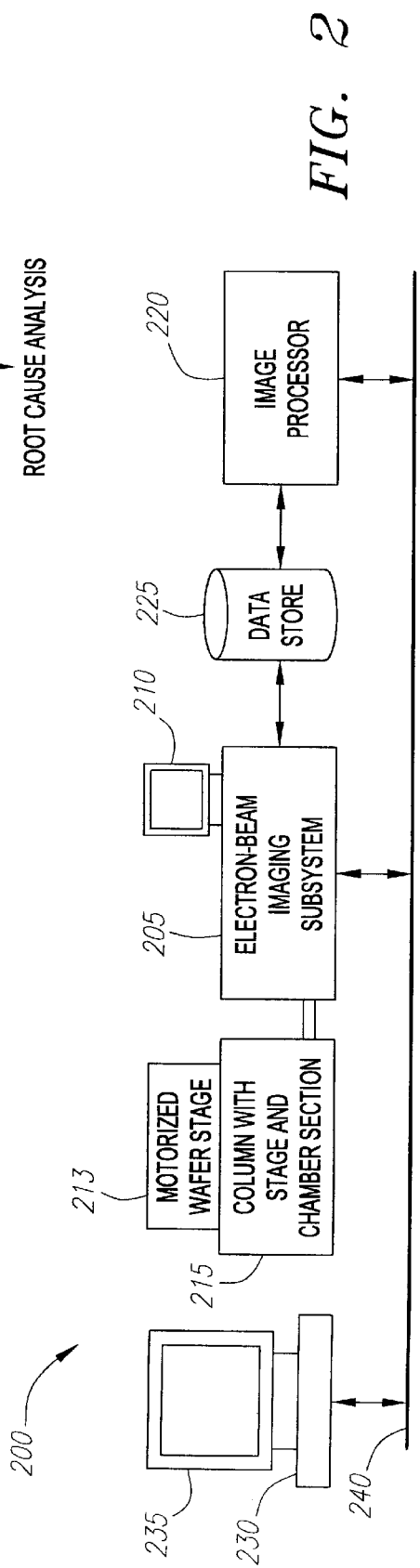
FIG. 2 is a schematic diagram of a system consistent with the present invention.

FIG. 2 shows schematically an exemplary system 200 for verification of wafers using voltage-contrast techniques consistent with the present invention. System 200 comprises an electron-beam subsystem 205 (such as an electron-beam imaging subsystem of a Schlumberger IDS® 10000 brand electron beam probing system) with optional display 210, a motorized wafer stage 213, an electron column 215 including a stage and vacuum chamber, an image processor 220, a data store 225 such as a 100 Gbyte disk driver and, optionally, a computer subsystem 230 with display 235. Electron-beam subsystem 205, image processor 220, and computer subsystem 230 communicate with one another via a network bus 240 or other suitable link. Electron-beam subsystem 205 can be, for example, an IDS® 10000 brand electron-beam probing system as offered commercially by Schlumberger Technologies, Inc. of San Jose, Calif., with software modified to enable operations consistent with the invention as will be described in more detail below. Such operations can include, for example, multiple asynchronous image processing, image alignment processing and review, wafer defect map creation and display, and import and export of images for review. Electron-beam subsystem 205 can also include modifications such as higher electron-beam energy or current as well as a pre-charging flood gun and related hardware and software elements for stable and controllable surface charging of a wafer with selected charge-up polarity, such as described in co-pending U.S. patent application Ser. No. 08/892,734 filed Jul. 15, 1997 of C. W. Lo et. al. Motorized wafer stage 215 can be, for example, a model MWS motorized wafer stage as offered commercially by Schlumberger Technologies, Inc. of San Jose, Calif., for handling and positioning a wafer relative to the electron column (not illustrated) of electron-beam subsystem 205. Image processor 220 can be, for example, a group of networked workstations or personal computers, such as a networked group of personal computers equipped with PENTIUM® II brand processors. Data store 225 provides capacity for storage of reference images and multiple, asynchronous image processing. Optional computer subsystem 230 with display 235 is provided to enable monitoring and review by a human operator of processes and images related to wafer inspection and verification operations.

Methods consistent with the present invention extract features from an image, such as by thresholding to produce a binary version of the feature image and then an optional grayscale image, or by comparison of features in the image with a feature template. The images can be aligned for mapping of features, or binary versions of the feature image can be aligned and corresponding features then matched. That is, features such as those which may be of electrical significance are extracted from the voltage contrast-image and then matched feature-by-feature before defect determination is made. This approach has benefits as compared with the prior pixel-based methods in that:

1. Reduced rate of nuisance defects and false defects and increased sensitivity to killer defects.
2. Shot noise reduction from averaging pixel values over the feature.
3. Only those parts of the images of likely electrical significance are extracted, so as to simplify and speed the defect determination process.
4. Potentially significant properties of the features, such as area, mean intensity, sum of intensity, shape, moments, etc., can be computed and compared because the process is based on features rather then pixels.
5. Processing workload may be reduced. By comparing images feature-to-feature rather than pixel-to-pixel, the number of operations is determined by the number of features (typically in the hundreds), not by the number of pixels (typically in the hundreds of thousands or millions). Computational resources are thus made available to improve defect detection robustness.
6. Alignment of reference and test images or image regions does not require pixel accuracy. Image alignment need only be close enough so that corresponding features between images or image regions will be correctly matched. Thus the required precision of the wafer stage and the image-alignment algorithms is determined by feature size rather than by pixel size.

Figure 3:
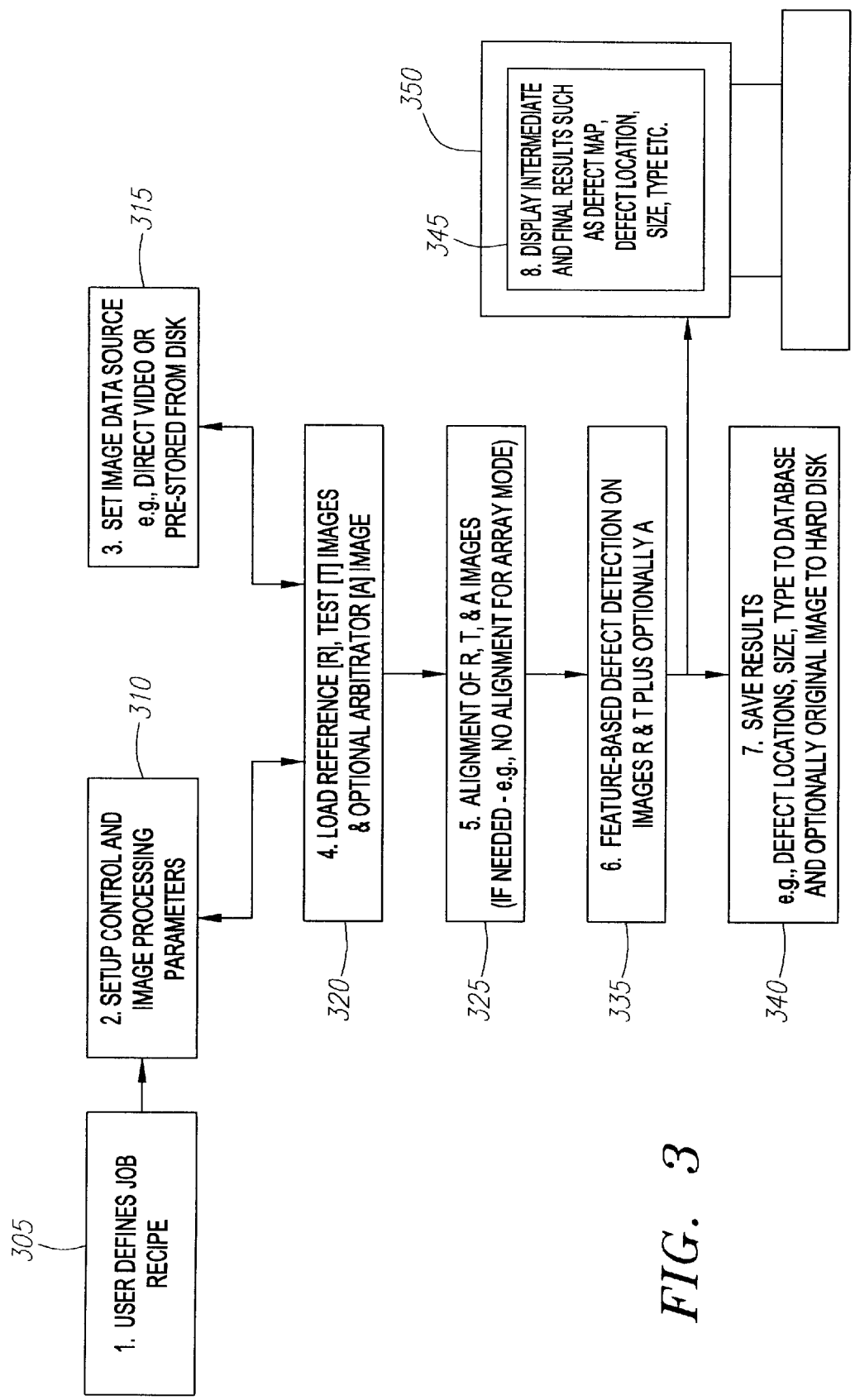
FIG. 3 is a high-level flow chart of some methods consistent with the invention.

FIG. 3 is a high-level flow chart of some methods consistent with the invention. At step 305, a graphical user interface displays a "job recipe" for review by a human operator. When the operator has selected or entered parameters for the job, the image processing (IP) algorithms and IP parameters are loaded into active storage at step 310, along with a template image if required for the job. At step 315, an image-data source is selected, e.g., either a direct-video (live) image or a previously-acquired image stored on disk. At step 320, a reference image R and a test image T to be processed are loaded into active storage at step 320, along with an arbitrator image A if required for the job. The use of arbitrator images is discussed in more detail below. In general, an arbitrator image is used when comparing images of two regions on a wafer to remove ambiguity as to which of the two is defective, e.g., when comparing images or image portions representing repetitive structures on a wafer such as neighboring memory cells. At step 325, the reference image and the test image are aligned and, if required for the job, also the arbitrator image.

Alternatively, step 325 is skipped if image alignment is not required, such as when an accurate stage is used and/or the images have been pre-aligned. At step 335, feature-based defect detection is performed. At step 340, results of defect detection, such as defect locations, size, type, etc., are saved to a database and/or reported and the image is optionally also saved for later reference. At step 345, intermediate images and results, such as a map of defects and statistics about defect location, size, type, etc., are optionally displayed for monitoring by a human operator on a display screen 350.

Figure 4:
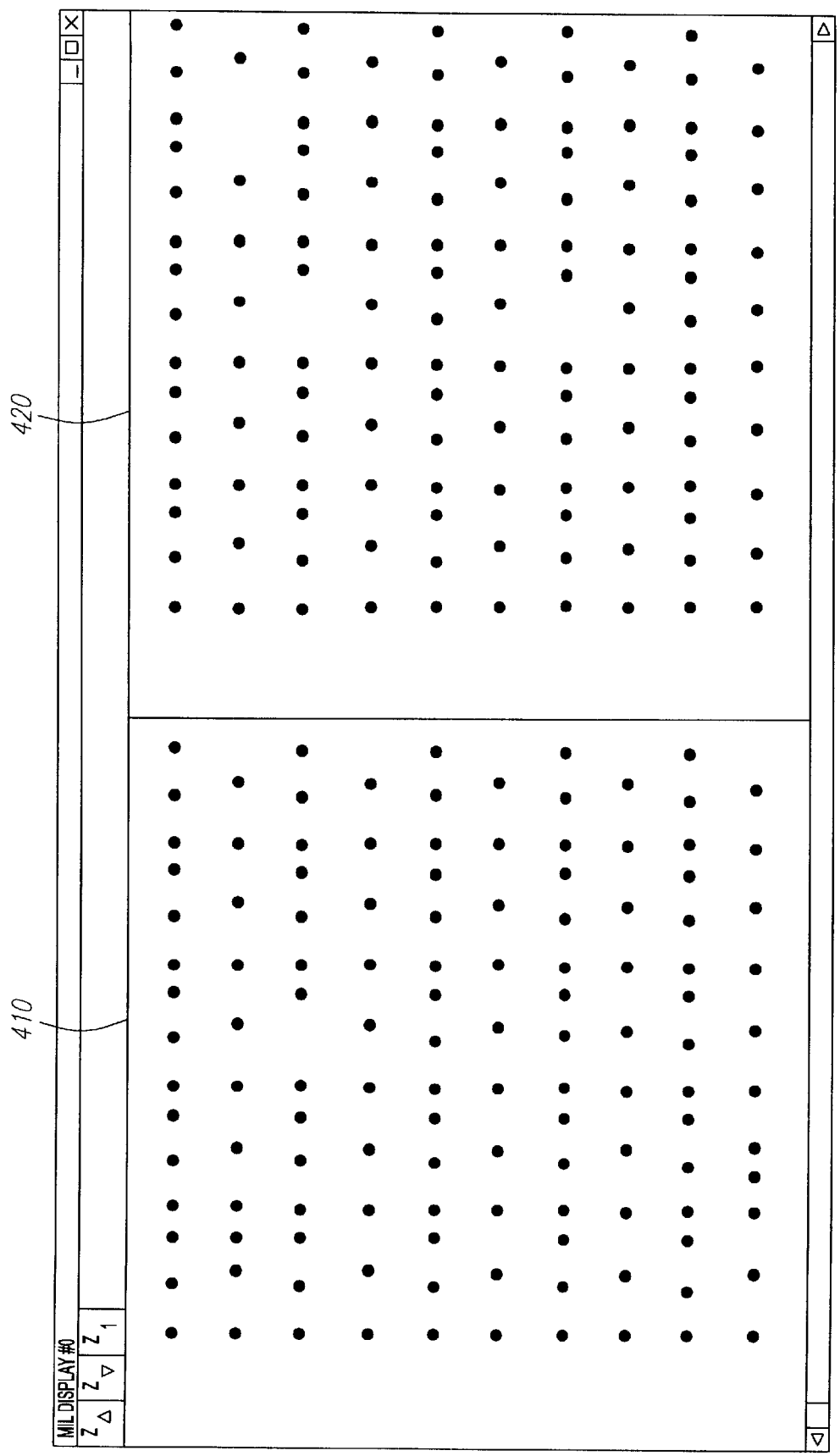
FIG. 4 is a split-screen view showing two voltage-contrast images of dies of a partially-manufactured semiconductor wafer.

FIG. 4 is a split-screen view showing two voltage-contrast images of dies of a partially-manufactured semiconductor wafer. The images are acquired at a stage of fabrication after contact holes are etched through a dielectric layer to expose contact elements. Each of the black dots represents a contact hole. Image 410 on the left side of FIG. 4 is a reference image taken of a first die. Image 420 is a test image taken of a second die. It is desired to inspect image 420 to identify defects of electrical significance, such as missing or incompletely-formed contact holes. Methods consistent with the present invention provide for inspection by matching of features between the images.

Figure 5:
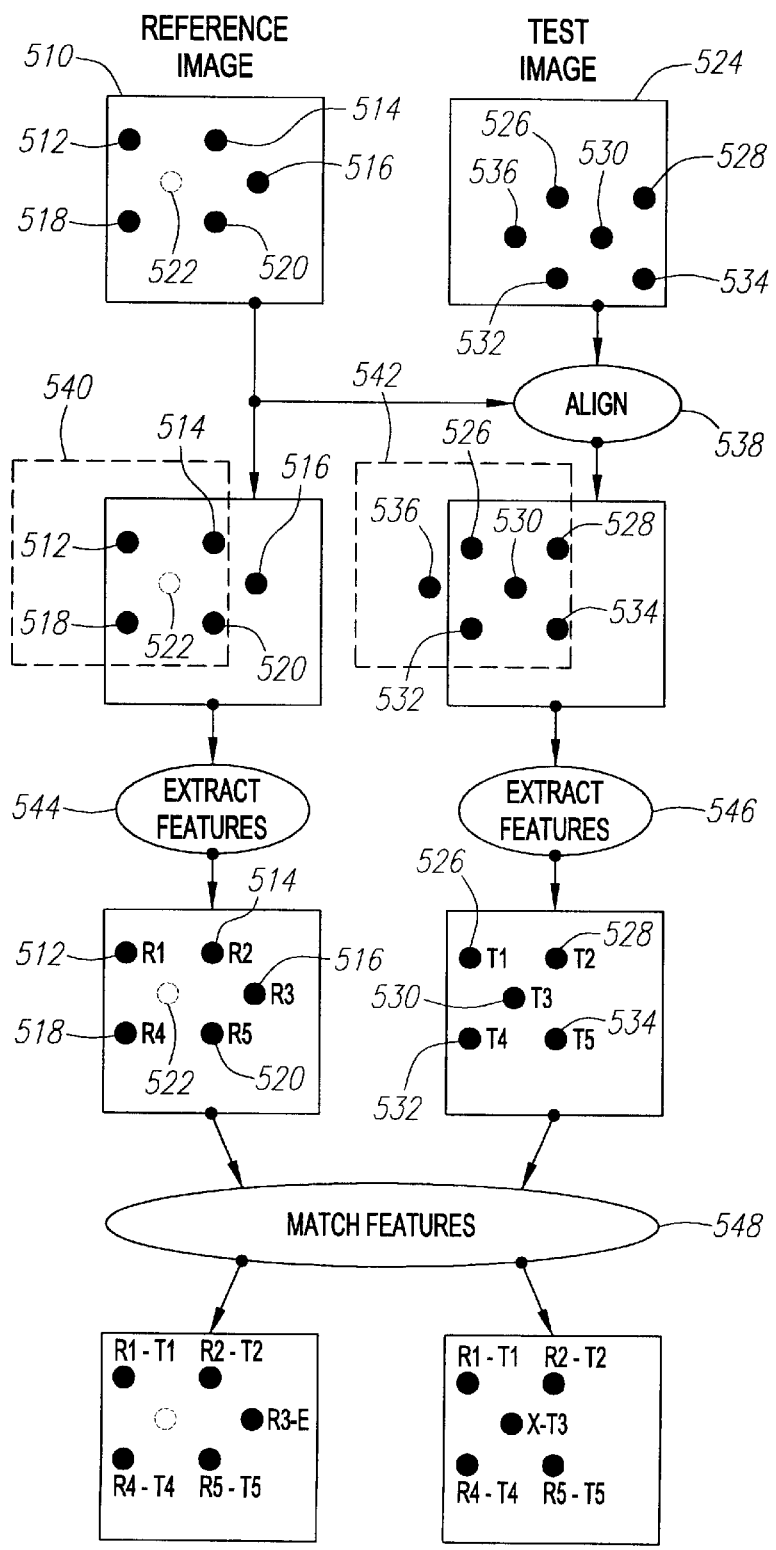
FIG. 5 is a high-level illustration of methods consistent with the present invention for matching feature between voltage-contrast images of contact holes.

FIG. 5 is a high-level illustration of methods consistent with the present invention for matching features between voltage-contrast images of contact holes. For convenience of illustration, only a small number of contact holes is shown in the images of FIG. 5, though the techniques are applicable to much larger fields of contact holes as well as to images of semiconductor features other than contact holes. A reference image 510 has five contact holes, shown as black dots 512, 514, 516, 518 and 520, and lacks a contact hole at a location indicated at 522. A test image 524 has contact holes shown as black dots at 526, 528, 530, 532, 534 and 536. Test image 524 is aligned with reference image 510 at step 538. The alignment is indicated for purposes of illustration by broken-line boxes 540 and 542 which indicate the overlapping regions of images 510 and 524, e.g., feature 512 corresponds to feature 526, feature 514 corresponds to feature 528, feature 516 has no counterpart in the test image, feature 518 corresponds to feature 532, feature 520 corresponds to feature 534, and location 522 corresponds to feature 530. Feature 536 of test image 524 has no counterpart in reference image 510. Features are extracted from the images in steps 544 and 546. The features extracted from the images are numbered to indicate that the features are identified as features following the feature extraction. At this step there is no correspondence between the feature numbers of the reference image and the feature numbers of the test image.

Figure 20A:
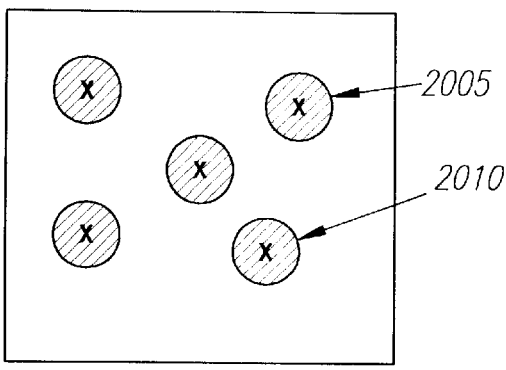
FIGS. 20A–20F illustrate a defect-detection process consistent with the present invention.
Figure 20B:
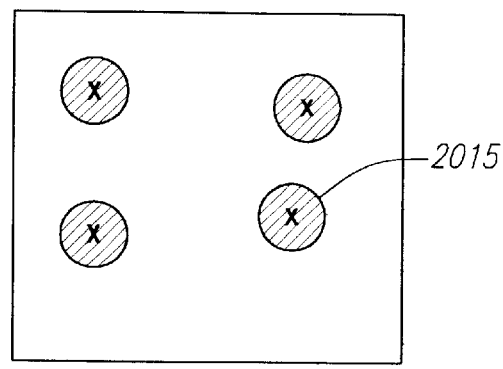
Figure 20C:
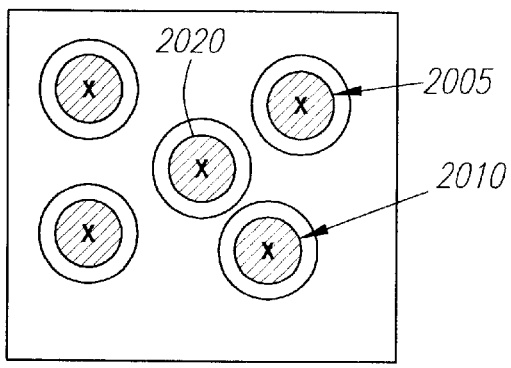
Figure 20D:
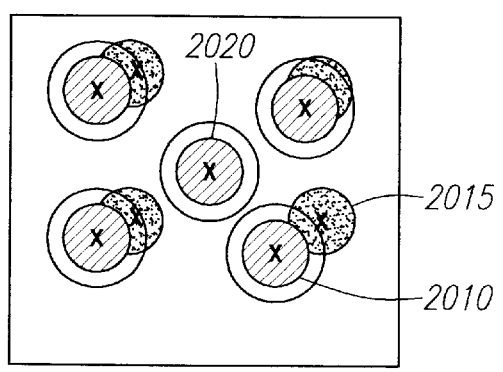
Figure 20E:
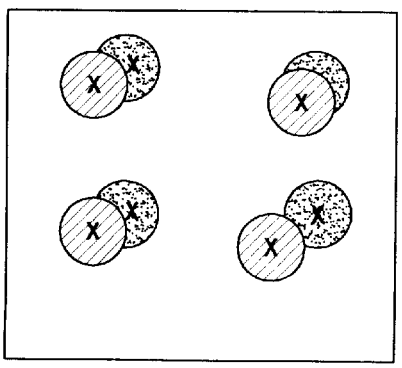
Figure 20F:
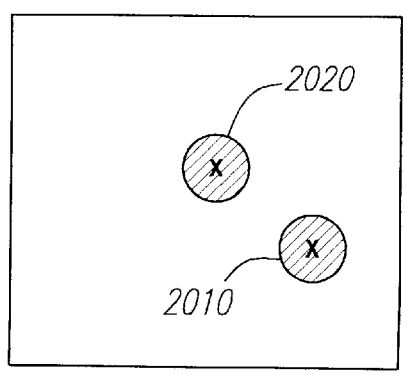

FIGS. 20A–20F illustrate a feature-matching process consistent with the present invention. FIG. 20A shows a portion of a reference image having a plurality of features representing contacts of a wafer, such as contacts 2005 and 2010, with the center point and boundary of each feature marked respectively with a cross and a circle. FIG. 20B shows a portion of a test image, also having a plurality of features representing contacts of a wafer with the center point and boundary of each feature marked respectively with a cross and a circle. FIG. 20C shows the reference image with additional rings surrounding each feature to indicate a limit of acceptable offset when comparing features of the test image with those of the reference image. FIG. 20D shows the test image of FIG. 20B overlaid on the reference image of FIG. 20C. Small alignment errors are visible. It can be seen that the center of one feature of the test image, feature 2015, falls outside the acceptable offset limit of feature 2010. It can also be seen that the center feature of the reference image, feature 2020, has no counterpart in the test image. FIG. 20E shows features which are "matched" in the process. FIG. 20F shows the features which the process has identified as "defects," a missing-feature defect is reported for feature 2020 and a displaced-feature defect is reported for feature 2010 because feature 2015 of the test image is outside the acceptable offset limit. After identifying the defects, a contrasting overlay, such as of contrasting color, can be displayed with the test image to make the defects readily visible to a human observer.

In addition to identifying and numbering the features, properties of the extracted features are determined. Once the features are extracted, calculating one or many properties of the features is a straightforward computational process. Properties can include (but are not limited to) area, size, shape, center of gravity, average intensity (which is particularly valuable for noise reduction in shot noise limited e-beam images), sum of intensity, and standard deviation of intensity. Table 1 gives examples of some feature properties, such as the coordinates (x, y) of the center of gravity of the feature, area (A) and average pixel intensity (I). The values given are for illustrative purposes and are not necessarily scaled to the images of FIG. 5.

TABLE 1

(Extracted Features)

| Reference Image 510 | | | | | Test Image 524 | | | | |
|---|---|---|---|---|---|---|---|---|---|
| Feature # | x | y | A | I | Feature # | x | y | A | I |
| R1 | 1.2 | 1.1 | 3.0 | 40 | T1 | 1.3 | 1.0 | 2.0 | 44 |
| R2 | 5.2 | 1.0 | 3.5 | 45 | T2 | 5.4 | 1.1 | 2.5 | 81 |
| R3 | 6.2 | 3.1 | 3.0 | 50 | T3 | 3.2 | 3.0 | 2.0 | 50 |
| R4 | 1.2 | 5.1 | 2.5 | 42 | T4 | 1.3 | 5.0 | 2.5 | 54 |
| R5 | 5.3 | 5.1 | 3.0 | 48 | T5 | 5.2 | 5.0 | 3.0 | 52 |

In step 548, features are matched. For example, features 512–520 are identified as features R1–R5 of reference image 510, while location 522 contains no feature. Features 526–534 are identified as features T1–T5 of test image 524. Features R1, R2, R4 and R5 of reference image 510 are respectively matched with features T1, T2, T4 and T5 of test image 524. Feature R3 of reference image 510 has no counterpart in test image 524 because it is outside the field of view of test image 524. Feature T3 of test image 524 has no counterpart in reference image 510 because it is missing in the reference image.

Table 2 shows a simple example comparing properties of matched features. A numbered feature of the reference image (R#) is compared with a numbered feature of the test image (T#), a difference between the feature area in the reference image (Aref) and the feature area in the test image (Atest) is calculated to obtain a difference area value (Adif), a ratio between Aref and Atest is calculated to obtain an area ratio value (Aratio). This ratio could be used as a defect measure. For example, any ratio greater than some threshold, say 1.2, could be considered a defective feature. A test is performed to determine whether the Aratio value is or is not greater than a threshold value (Ar>1.2).

TABLE 2

(Compared Features)

| R#–T# | Aref | Atest | Adif | Aratio | Ar > 1.2 | Defect? |
|---|---|---|---|---|---|---|
| Matched Features: | | | | | | |
| R1–T1 | 3.0 | 2.0 | 1.0 | 1.5 | True | Yes |
| R2–T2 | 3.5 | 2.5 | 1.0 | 1.4 | True | Yes |
| R4–T4 | 2.5 | 2.5 | 0.0 | 1.0 | False | No |
| R5–T5 | 3.3 | 3.0 | 0.3 | 1.1 | False | No |
| Unmatched Features | | | | | | |
| R3–TE | Outside of field of view | | | | Unknown | Unknown |
| RX–T3 | Missing in field of view | | | | N/A | Yes* |

*Defect in the reference image (can occur when the reference image is of a real die)

After properties of the feature are calculated, they can be compared individually or in combination(s). A defect can be reported, for example, if the feature properties differ by a predetermined amount. Numerically this comparison can be, but is not limited to, a subtraction, a ratio (both are commonly used), a greater-than or less-than function, etc. Combining properties can increase the sensitivity of defect detection without increasing the nuisance-defect rate. For example, the sum of the intensities of all pixels in the feature combines a measure of area with an averaging of intensity and is particularly good for detecting a defect that results in a subtle gray level change but that also (as is the case for contacts or vias) changes the apparent size of the defective feature as described in co-pending U.S. patent application Ser. No. 09/226,962. Table 2 also shows defects classified as missing features or extra features.

Figure 21:
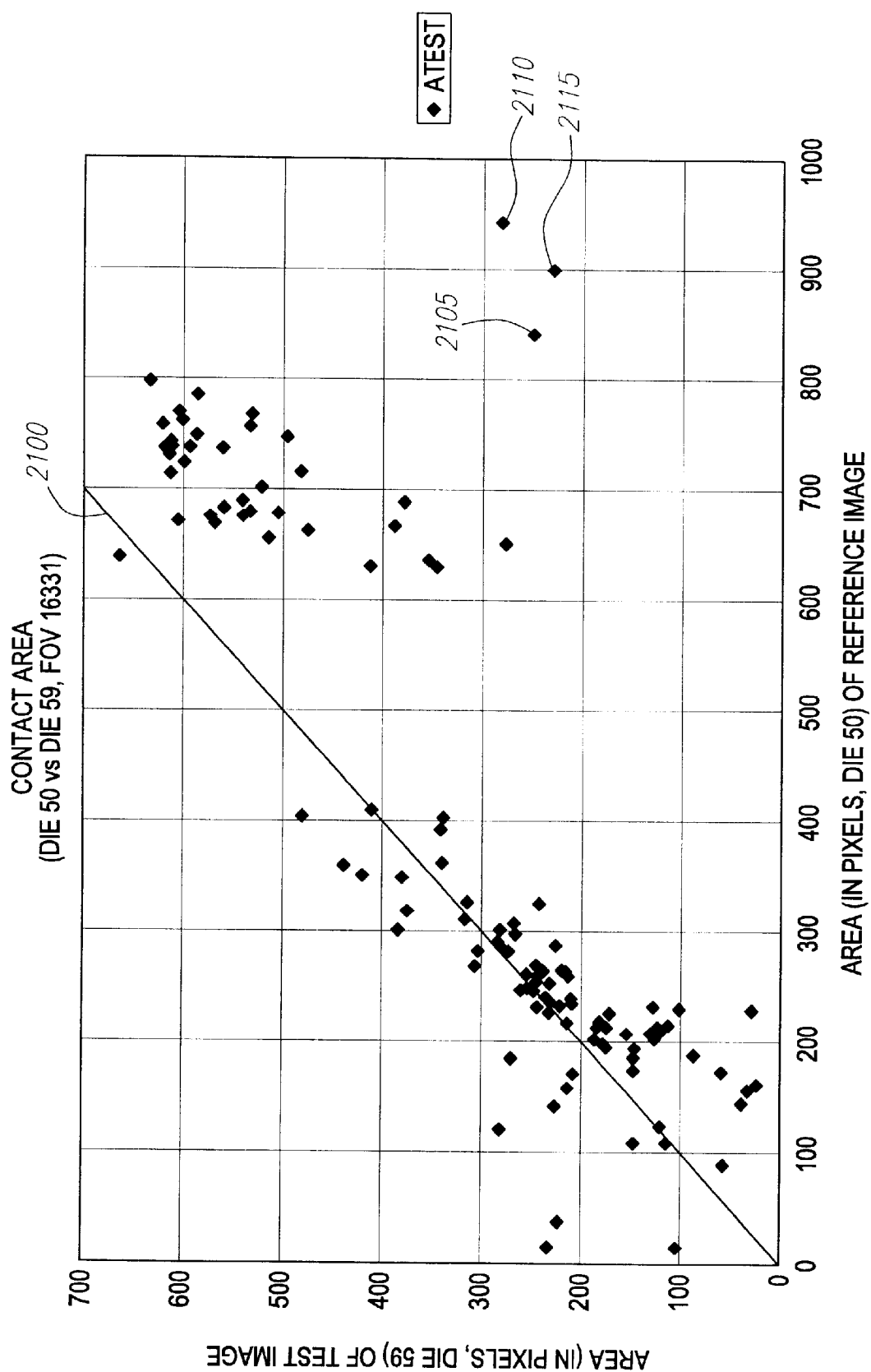
FIG. 21 shows a plot of the computed area of test-image features vs. the computed area of reference-image features.

Another approach is to calculate statistics, such as means, standard deviations, and/or linear regressions, on differences between the properties of interest. Features whose properties differ by more than, for example, two standard deviations of the distribution of differences, can be reported as defects. This approach avoids the need to set a fixed threshold on the difference between feature properties. (Fixed thresholds are error-prone because they can be set incorrectly and because, even when set correctly, they do not adapt to subtle changes in the image such as changing contrast or brightness.) Instead, the threshold is adaptive within a selected range of statistical significance. The mean and standard deviation of feature property differences are themselves also a measure of the defect density on the wafer. This adaptive approach is useful, for example, in the case of a bad wafer with numerous defects, as the standard deviation will be large and only the worst defects will be reported. With a bad wafer, the mean and standard deviation themselves indicate poor yield. With a high-yield wafer, killer defects stand out clearly from the difference distribution and can be correctly reported as defects. FIG. 21 is an example showing a plot of the computed area of test-image features vs. the computed area of reference-image features. Perfectly-matched images would have the areas plotted along "perfect matching" line 2100. Plotted feature areas located well away from line 2100, such as areas 2105, 2110 and 2115 are readily identified as potential killer defects.

FIG. 6 is a flow chart showing methods consistent with the present invention. Feature-based defect detection begins at step 605. At step 610, reference and test images and, optionally, an arbitrated image, are prepared. The reference and test images are optionally aligned with one another at step 615, as desired or required. Image alignment methods are known in the art and will not be detailed here—for example, U.S. Pat. No. 5,054,097 to Flinois et. al. shows techniques for aligning images, and products such as the IDS® 10000 brand electron-beam imaging system commercially available from Schlumberger Technologies, Inc. of San Jose, Calif. include image alignment capabilities. Features are extracted from the images at step 620. Steps 615 (alignment) and 620 (feature extraction) can be performed in either order or concurrently without affecting the result, unless the alignment algorithm uses extracted feature information for alignment. Extracted features are matched at step 625, optionally using alignment information. Features are compared at step 630 to identify defects. The identified defects reported and/or a record of them is saved, in optional step 635. The report can, for example, take the form of a display or print-out of the test image with a contrasting (e.g., different-colored) overlay which shows the identified defects, along with tabulated feature statistics.

Step 640 checks whether a further image is to be inspected for defects. If yes, the process is repeated, beginning again at step 610. If no, the process ends at step 645. If not required, preparation of the reference image can be skipped at step 610. For example the reference image need not be prepared on each repetition if the same reference image is used each time a test image is to be inspected, or if the reference image to be used for the next repetition is the test image from the previous repetition.

FIG. 7 shows a more detailed embodiment of step 610 in which the images are read (for those which were previously acquired and stored) or acquired at step 7610A. The images are smoothed if desired at optional step 7610B. The images are normalized if desired at optional step 7610C. Methods for smoothing images, such as Gaussian-spatial-smoothing, and for normalizing images, such as pixel-intensity-normalization are known in the art. As the goal in smoothing is noise reduction or noise elimination, other techniques can be used to reduce noise, such as increasing beam current during image acquisition and temporal averaging (versus spatial smoothing).

FIG. 8 shows a more detailed embodiment of step 630. Properties of image features are computed at step 8630A. The computed feature properties are compared at step 8630B. A determination is made at step 8630C whether the comparison results meet defect criteria.

FIG. 9 shows one way in which steps 610, 615 and 620 can be carried out. A reference image R is read and stored, or is acquired, at step 9610A. Reference image R is smoothed at optional step 9610B. Features are extracted from reference image R at step 9620A. A test image T is read and stored, or is acquired, at step 9610C. Test image T is smoothed at optional step 9610D and normalized to reference image R at optional step 9610E. Test image T is aligned with reference image R at optional step 615. Features are extracted from test image T at step 9620B.

FIG. 10 shows a more detailed embodiment of step 630 in which features are compared to identify defects. Features properties of reference image R and test image T are computed at step 10-630A. The computed feature properties of reference image R and test image T are compared at step 10-630B. Property-comparison statistics are calculated at step 10-630C. A determination of whether the property-comparison statistics meet predetermined defect criteria is made at step 10-630D.

FIG. 11 shows a more detailed embodiment of step 635 in which data regarding detected defects are reported and/or stored. A determination is made at step 11-635A whether defects have been identified. If yes, the defect feature property statistics are reported at step 11-636B. The defect property statistics and/or other image information is reported or saved in storage at step 11-635C.

Figure 12:
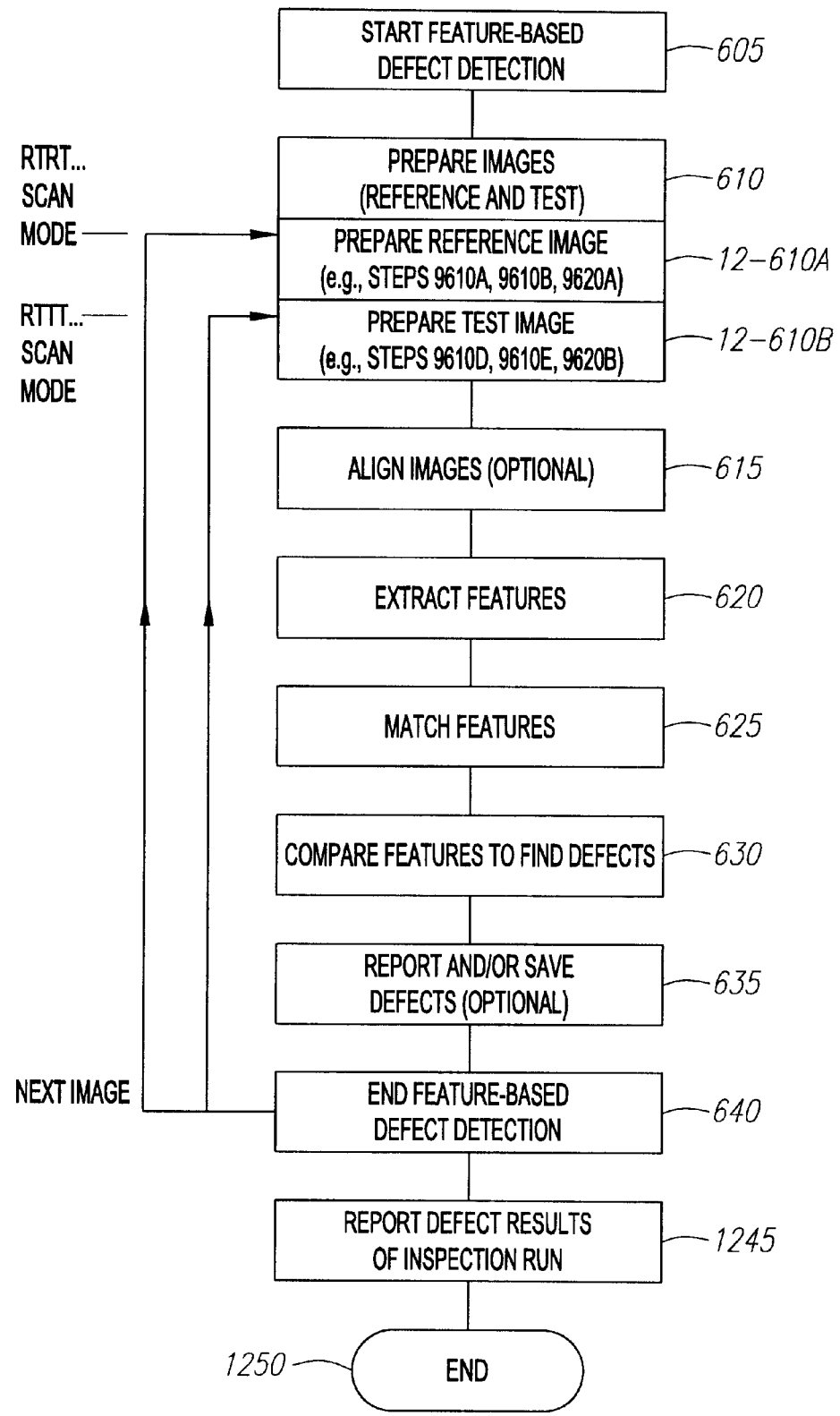
FIG. 12 shows a more detailed embodiment of the method of FIG. 6 consistent with the present invention.

FIG. 12 shows a further detailed embodiment illustrating alternate repetition modes. Feature-based detect detection begins at step 605. The reference image and test image are prepared at step 610. The reference image is prepared at step 12-610A, e.g., as in steps 9610A, 9610B and 9620A of FIG. 9. The images are aligned at optional step 615. Features are extracted at step 620. Features are matched at step 625. Features are compared to identify defects at step 630. Defects data are reported and/or saved at optional step 635. The process then repeats: if the mode of operation is to scan a reference image, then a test image, then a reference image, then a test image in an alternating pattern RTRT . . . , then step 12-610A is performed at each repetition; if the mode of operation is to scan a reference image only once and then to compare with multiple test images in a sequential pattern RTTT . . . , then the repetition begins at step 12-610B. When all images have been inspected, feature-based defect detection ends at step 640. Defect-detection results for the inspection run are reported and/or stored at step 1245. The process ends at step 1250.

Figures 13, 14:
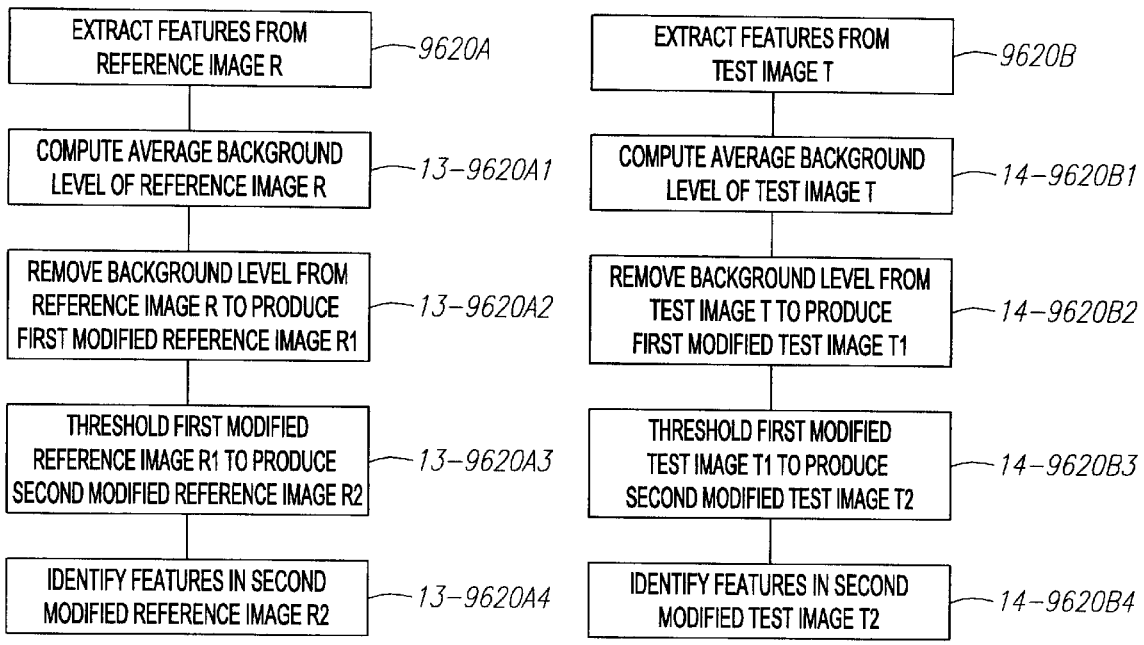
FIG. 13 shows a more detailed embodiment of step 9620A of FIG. 9 consistent with the present invention.
FIG. 14 shows a detailed embodiment of step 9620B of FIG. 9 consistent with the present invention.

FIG. 13 shows a more detailed embodiment of extracting features from reference image R at step 9620A. An average background level of reference image R is computed at step 13-9620A1. The background level is removed from the pixel intensities of reference image R to produce a first modified reference image R1 at step 13-9620A2. Removal of the background level is optionally performed because some voltage contrast images do not have uniform contrast. The non-uniform contrast can result in reporting of false defects if simple pixel-subtraction algorithms are used without first subtracting or normalizing the pixel intensity level of the background. The background is the area of the image between the features. Typically the features of a wafer on which defect-detection is performed are conductors, such as wires, vias or contacts. The area surrounding these features is typically dielectric, today mostly $SiO_2$. The background area of an image of the wafer represents the dielectric. Artifacts caused by non-uniform charging of the wafer surface sometimes result in slightly different surface potential and thus a background intensity which varies across the image. Removing or normalizing the background pixel-intensity can improve the robustness of feature extraction. For purposes of this document, the term "background" removal is intended to include either subtraction of the background level or normalization of the background level or any other suitable technique for compensating non-uniform contrast of an image. The pixels of first modified reference image R1 are thresholded at step 13-9620A3 to produce a second modified reference image R2, e.g., a binary image. Features in second modified reference image R2 are identified at step 13-9620A4. In general, the goal of background removal is to enhance features. Other techniques for feature enhancement are also known. For example if the feature to be extracted consisted of long straight lines, edge enhancement may be performed on the image before feature extraction.

FIG. 14 shows a more detailed embodiment of extracting features from test image T at step 9620B. An average background level of test image T is computed at step 14-9620B1. The background level is removed from the pixel intensities of test image T to produce a first modified test image T1 at step 14-9620B2. The pixels of first modified test image T1 are thresholded at step 14-9620B3 to produce a second modified test image T2, e.g., a binary image. Features in second modified test image T2 are identified at step 14-9620B4.

Figures 15, 16:
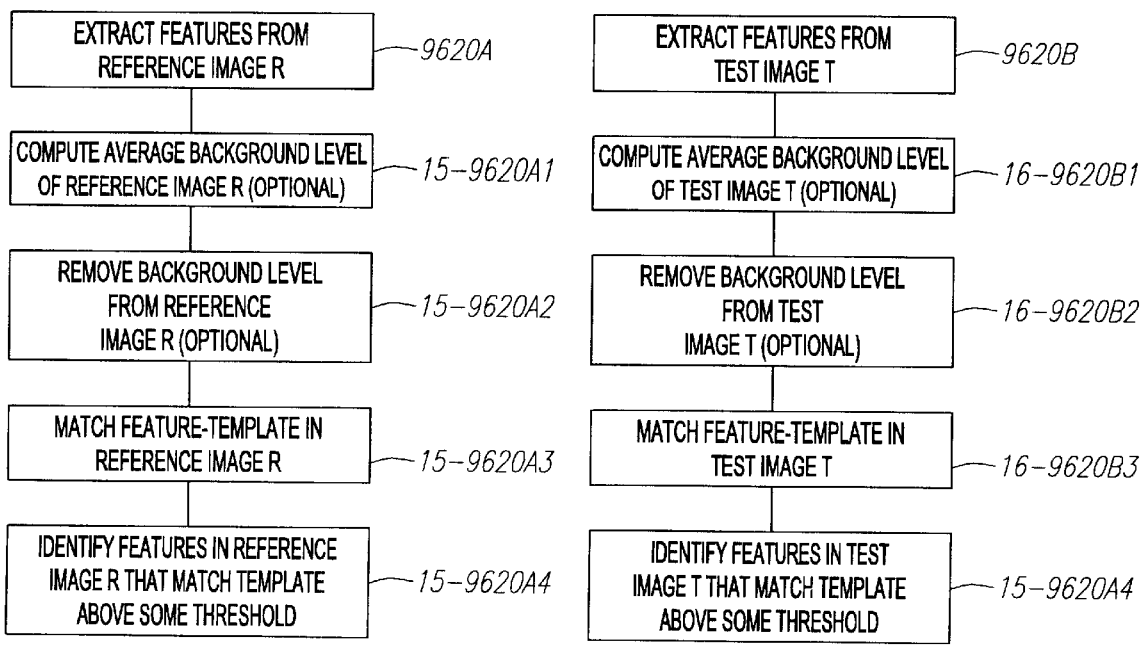
FIG. 15 shows an alternative detailed embodiment of step 9620A of FIG. 9 consistent with the present invention.
FIG. 16 shows an alternative detailed embodiment of step 9620B of FIG. 9 consistent with the present invention.

FIG. 15 shows another embodiment of extracting features from reference image R at step 9620A. An average background level of reference image R is computed at optional step 15-9620A1. The background level is removed from reference image R at step 15-9620A2. A feature template is then matched in the reference image (or in the image resulting after removal of background level) at step 15-9620A3. Features in the reference image that match the template above some threshold, e.g., above a predetermined average intensity, are identified at step 15-9620A4 as features present in the reference image.

FIG. 16 shows another embodiment of extracting features from test image R at step 9620B. An average background level of test image T is computed at optional step 16-9620B1. The background level is removed from the pixel intensities of reference image R at step 16-9620B2. A feature template is then matched in the test image (or in the image resulting after removal of background level) at step 16-9620B3. Features in the test image that match the template above some threshold, e.g., above a predetermined average intensity, are identified at step 16-9620B4 as features present in the test image.

Figure 17A:
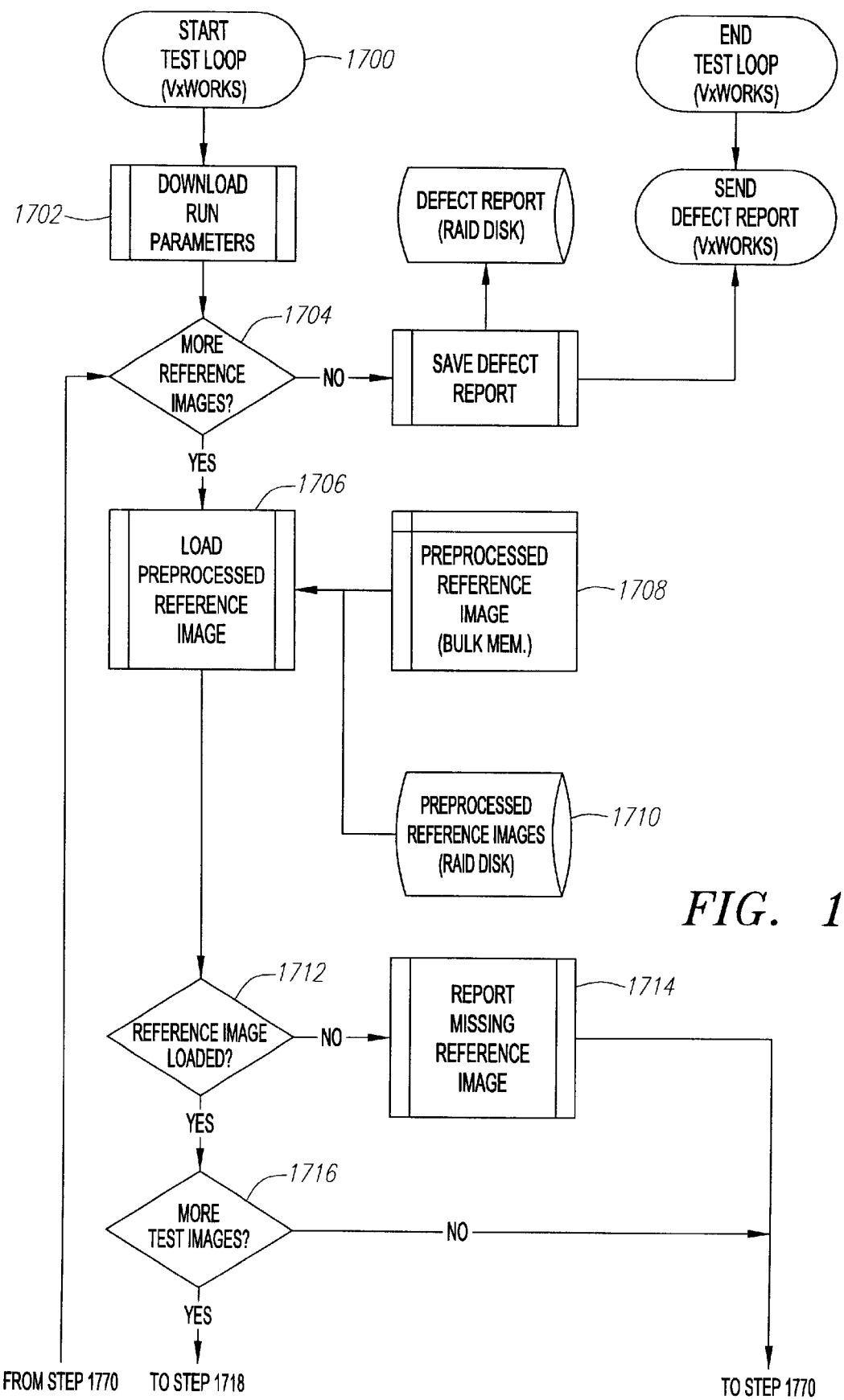
FIGS. 17A, 17B, 17C and 17D show a flow diagram of a feature-based defect-detection implementation consistent with the present invention.
Figure 17B:
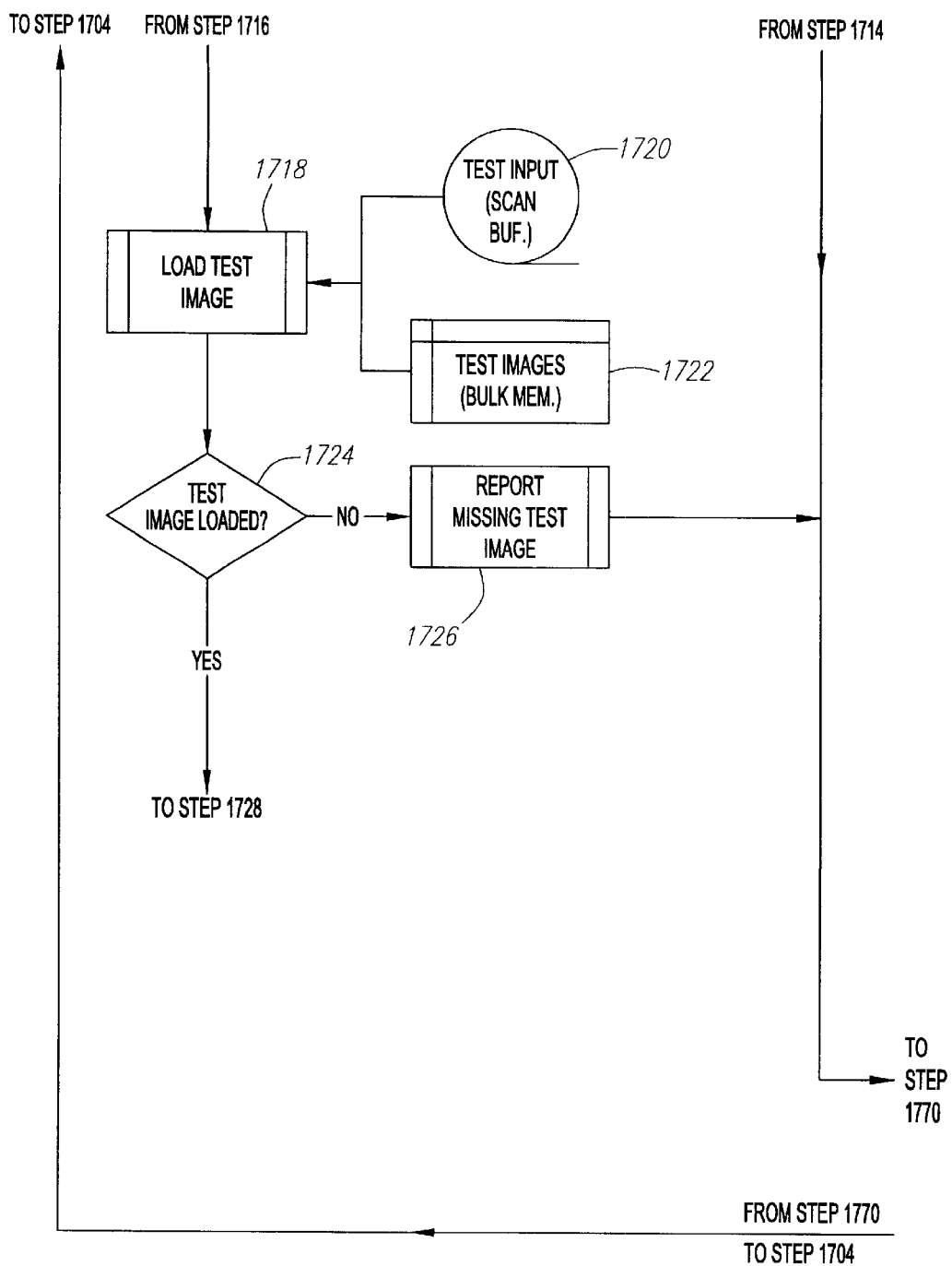
Figure 17C:
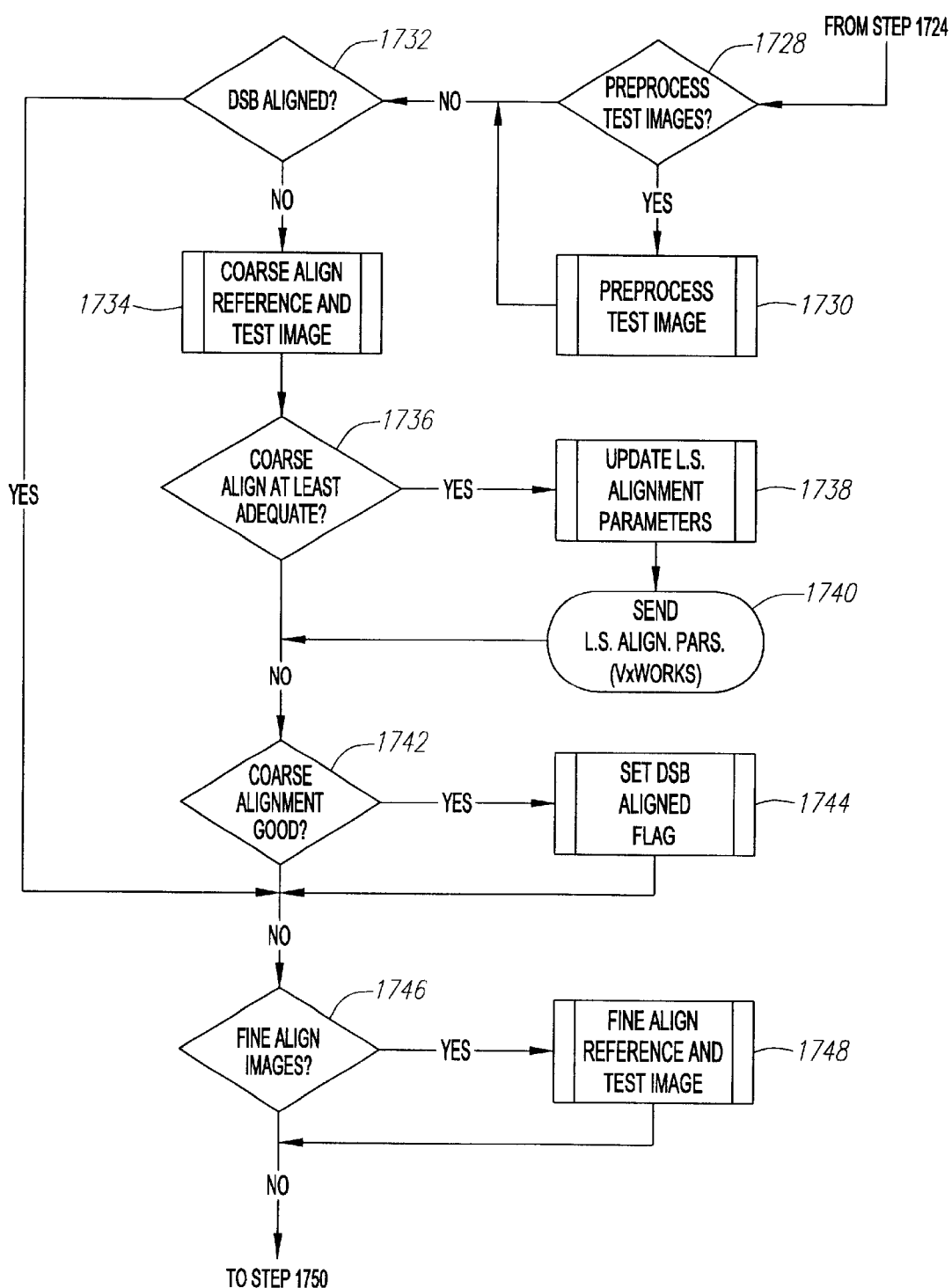
Figure 17D:
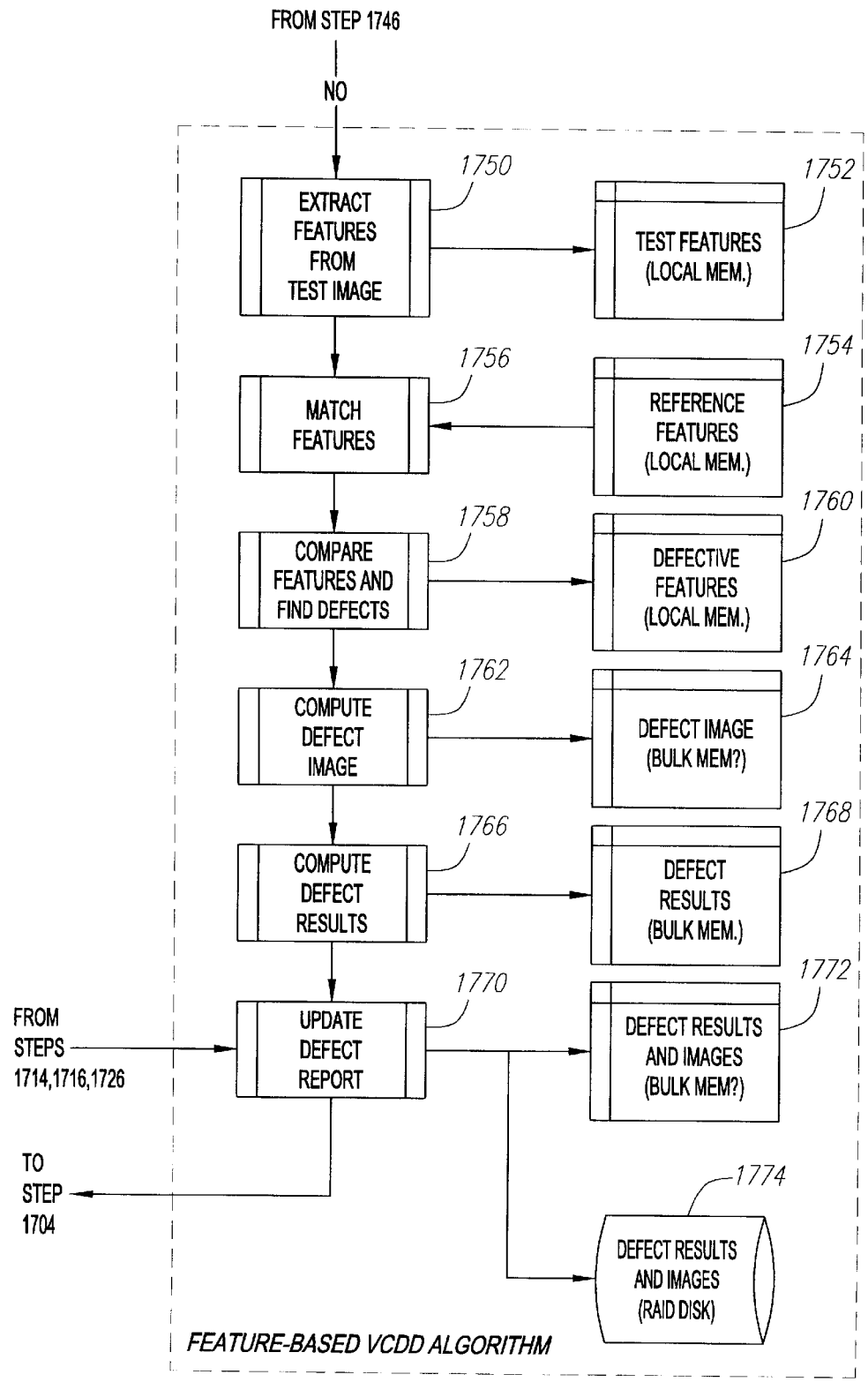

FIGS. 17A, 17B, 17C and 17D show a flow diagram of a feature-based defect-detection implementation consistent with the present invention. Referring first to FIG. 17A, the process begins at step 1700. It can be run on a computer system employing any suitable operating system software, for example, the VXWORKS® brand operating system software commercially available from Wind River Systems. At step 1702, run parameters are downloaded (i.e., received by the process), such as which reference and test images to compare, flags, etc. At step 1704 a check is made on whether there are reference images to be compared with test images. Since the process has just begun and there is at least one reference image to be used for comparison, control passes to step 1706. At step 1706, a pre-processed reference image is loaded for use by the process, e.g., from bulk memory 1708 or disk 1710. Bulk memory is large, high-speed, random-access memory. At step 1712, a check is made to assure the reference image is loaded. If no, a report is made at step 1714 that the reference image is missing and control passes to step 1770 (FIG. 17D). If yes, then a check is made at step 1716 to determine whether more test images are to be processed.

Referring to step 1716 of FIG. 17B, if no more test images are to be processed, control passes to step 1770 (of FIG. 17D). If another test image is to be processed, then the test image is loaded at step 1718 from a live-image source 1720, such as an image scan buffer, or from a stored-image source 1722, such as bulk memory. At step 1724, a check is made whether the test image is loaded. If no, then a report is made at step 1726 that the test image is missing and control passes to step 1770 (FIG. 17D). If yes, then a check is made at step 1728 of FIG. 17C whether the test images are to be preprocessed. If yes, then preprocessing is performed at step 1730 and control passes to step 1732. At step 1732, a check is made whether the reference and test images are already aligned. (The images may already be pre-aligned based on stage accuracy and repeatability, or by operation of an analog scan generator as in the electron-beam imaging subsystem of Schlumberger's IDS® 10000 brand electron-beam imaging system, or by a digital scan generator ("DSB").) If yes, then control passes to step 1742. If no, then a coarse alignment is performed at step 1734. At step 1736, a check is made whether the coarse alignment is adequate. If yes, then the alignment parameters are updated at step 1738 and saved to a file and/or sent to a control computer (e.g., running a real-time operating system such as the VXWORKS® brand operating system by Wind River Systems, Inc. or, if there is no real-time operating system, the control computer may be a single-board computer such as a Mizar single-board computer) at step 1740, and control passes to step 1742. At step 1742, a check is made whether the coarse alignment is good. If yes, then an "Aligned" flag (if using an analog scan generator) or "DSB Aligned" flag (if using a digital scan generator) is set at step 1744. At step 1746, a check is made whether the images are to be fine aligned. If no, control passes to step 1750 (FIG. 17D). If yes, fine alignment of the reference and test images is performed at step 1748 and control then passes to step 1750 (FIG. 17D).

Referring to FIG. 17D, features are extracted from the test image at step 1750 and stored in local memory at step 1752. Reference-image features are retrieved from local memory at step 1754 and matched with the test-image features at step 1756. At step 1758, features are compared to find defects. Defects are stored at step 1760, such as in local memory. A "defect image" is computed at step 1762, e.g., a binary or gray-scale image showing the defects identified in step 1758. Defect results are computed at step 1766, such as statistical information about the nature and quantities of defects. Defect results are stored at step 1768, such as in bulk memory. At step 1770, an updated defect report is prepared. Defect results and images are stored in bulk memory at step 1772 and/or in disk storage at step 1774.

Figures 18F, 18G, 18H:
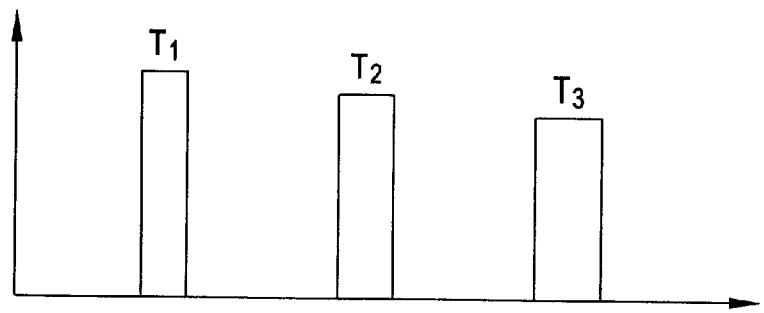

FIGS. 18A through 18H illustrate feature extraction by thresholding in a manner consistent with the present invention. In this example, only pixels having an intensity value above a threshold level are considered to be part of a feature. In FIG. 18A, a gray-scale image 1800 contains a field of contact features such as features 1805 which appear "bright" relative to the background intensity. In FIG. 18B, a three-dimensional view of the image at 1810 shows the field of features with their pixel intensities plotted in the third dimension. A plane 1815 passing through the features represents a threshold to be applied to the pixel intensities. FIG. 18C is a plot along a line intersecting a row of features, showing gray-scale intensity of the pixels. A pixel-intensity threshold at 1820 shows how feature and non-feature regions can be readily separated in this image. Edges of a feature 1825 are seen at 1830 and 1835. The level of the threshold affects where the edges of the feature are defined. FIG. 18D shows the features of FIG. 18C after thresholding. FIG. 18E shows a resulting image in which the features are defined by pixels having binary values. The resulting image of FIG. 18E is combined with the gray-scale image of FIG. 18A, such as with a blob analysis operation or by using the identified binary feature map as a mask, to produce a list of blob features defining an output image. For example, the blob analysis operation can be as provided by the Matrox imaging library, using a command such as "matrox_blob_ calculate (E,A,linked_list_of_blob_features)" where "E" and "A" are input data representing the images of FIGS. 18E and 18A, respectively. FIG. 18F shows what the features of FIG. 18D might look like after blob analysis and assignment of feature numbers, such as T1–T3. FIG. 18G is an output image showing the identified features T1–T6. FIG. 18H shows a data structure produced by the blob analysis operation, identifying the features by feature number and by properties such as x-y position in the image, area and intensity. The feature properties can be compared, stored and analyzed as desired.

Thresholding has been found to work well in certain situation, e.g. with very dark contacts on a gray background. Thresholding has limitations, however, such as when it relies on a human operator to set a suitable threshold, and/or when the feature of interest has a gray level similar to the background and can only be identified by intensity changes at the edges of the features. Reliance on a human operator can be overcome with adaptive thresholding, in which the threshold values are not fixed but can vary over the image. This can be used to overcome contrast differences across an image due to effects such as surface charging of the specimen in a voltage-contrast image, or illumination differences in an optical image. The adaptive or variable threshold can be determined for example by using a fixed offset from the local average gray level or local background level determined during background removal. An advantage is that an adaptive-threshold approach accommodates gray level changes due to non-uniform charging of the insulating background—a common problem with charged particle beam systems.

Figure 22A:
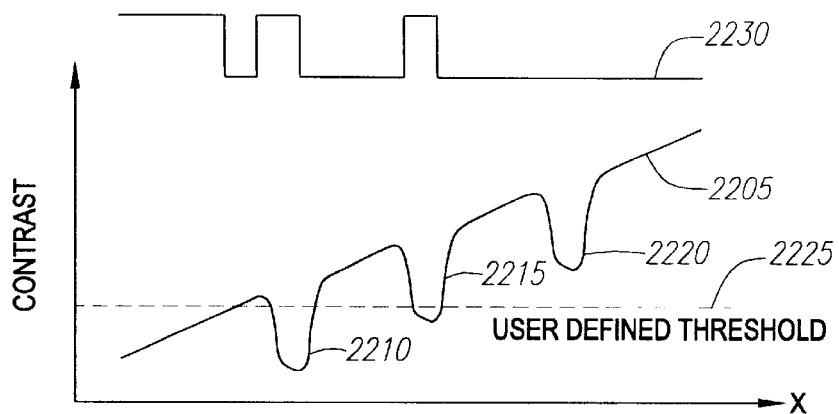
FIGS. 22A–22C illustrate feature extraction by adaptive thresholding in a manner consistent with the present invention.
Figure 22B:
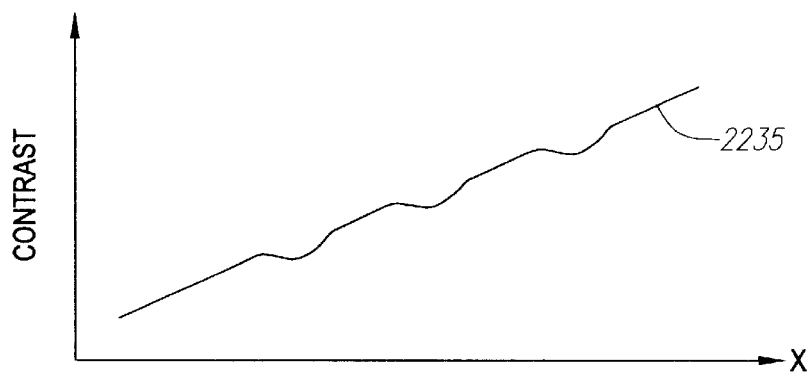
Figure 22C:
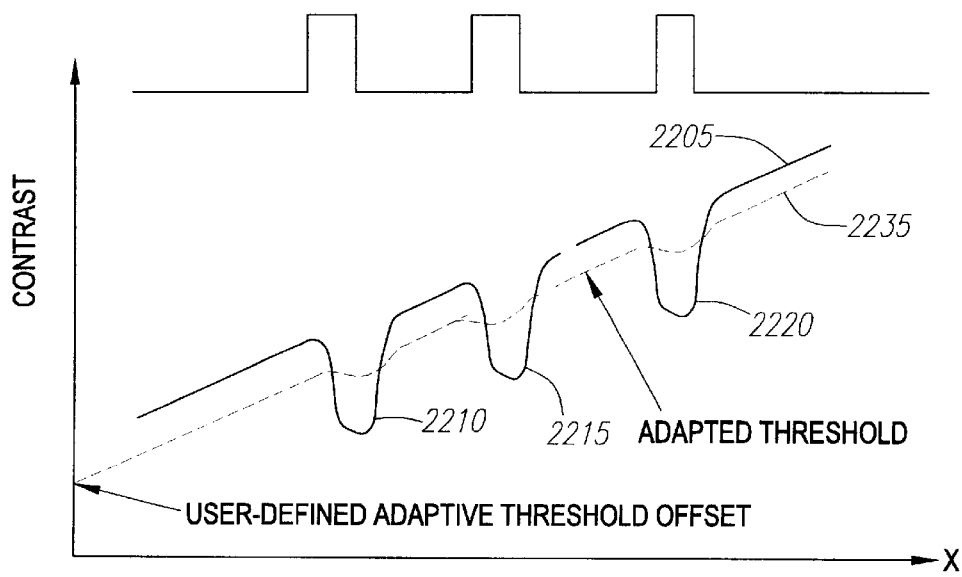

FIGS. 22A–22C illustrate feature extraction by adaptive thresholding in a manner consistent with the present invention. FIG. 22A shows a profile 2205 of a voltage contrast image of a patterned substrate having contact holes which appear as dark areas on an uneven or graded background contrast. Profile 2205 is a plot of image contrast in the x-direction along a line intersecting three contact holes. The uneven or graded background contrast can be caused, for example, by uneven charging of dielectric material. Dips 2210, 2215 and 2220 of profile 2205 respectively represent contact holes. For purposes of illustration, FIG. 22A also shows a non-adaptive, fixed threshold 2225. Limitations of the fixed threshold can be seen from the binary, representation 2230 which changes level at each point where profile 2205 crosses threshold 2225, but which does not accurately represent the contact hole locations. FIG. 22B shows an adaptive threshold profile 2235 created by smoothing of profile 2205. FIG. 22C shows adaptive threshold profile 2235 superposed on profile 2205. The benefit of an adaptive threshold can be seen from the binary representation 2240 which changes level at each point where profile 2205 crosses threshold 2235, and which accurately represents the contact hole locations.

Image model matching can be used instead of, or in combination with, thresholding techniques. A model of the feature to be extracted is used to identify where the features are, rather than using image intensity. A simple example of this method is to correlate the feature model with the image to produce a correlation image. The correlation image is thresholded to identify features, using a correlation-level threshold instead of an intensity-level threshold. Edges of the feature in the image are then detected using pattern matching techniques. Pattern matching techniques are known, for example, from R. Haralick et. al., Computer and Robot Vision, Vol. II, Addison Wesley (ISBN 0-201-56943-4), the content of which is incorporated herein by this reference. Pattern-matching software programs are commercially available in the MATROX® brand Imaging Libraries of Matrox Electronic Systems Limited and in the PATMAX® brand software from Cognex Corporation. Synthetic model-matching can also be employed, in which the model is not a physical image model but instead made up from simple geometric shapes (such as rectangles, circles, rings, lines) that can combine to form an idealized (synthetic) model of the feature to be matched. An example of a synthetic model might be a "doughnut" constructed with a dark ring and a smaller, brighter circle. The model matching would in this example comprise three steps: 1. Find all "dark rings" in the image; 2. Find all "bright circles"; 3. Find all "bright circles" within the "dark rings". With this method a whole range of "doughnut" like features can be extracted without having to know the exact relationship between the light and dark part of the feature, only that the light part was within the dark part.

Figure 19A:
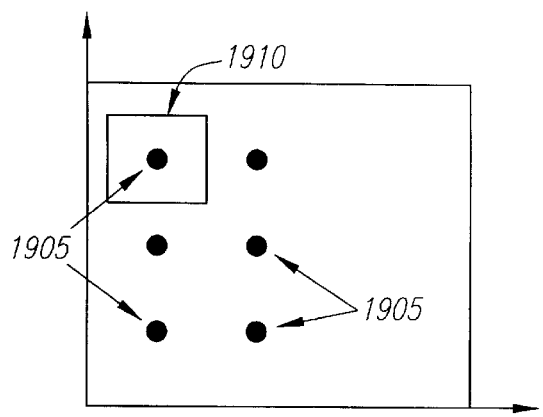
FIGS. 19A–19G illustrate feature extraction by model matching in a manner consistent with the present invention.
Figure 19B:
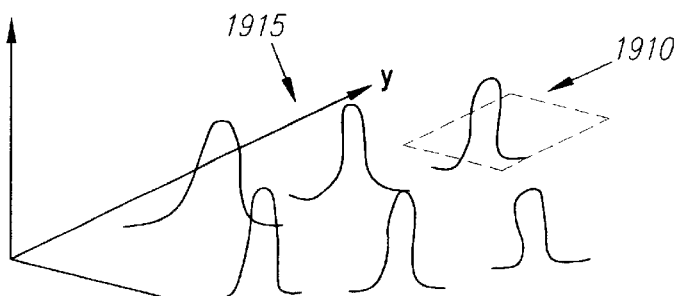
Figure 19C:
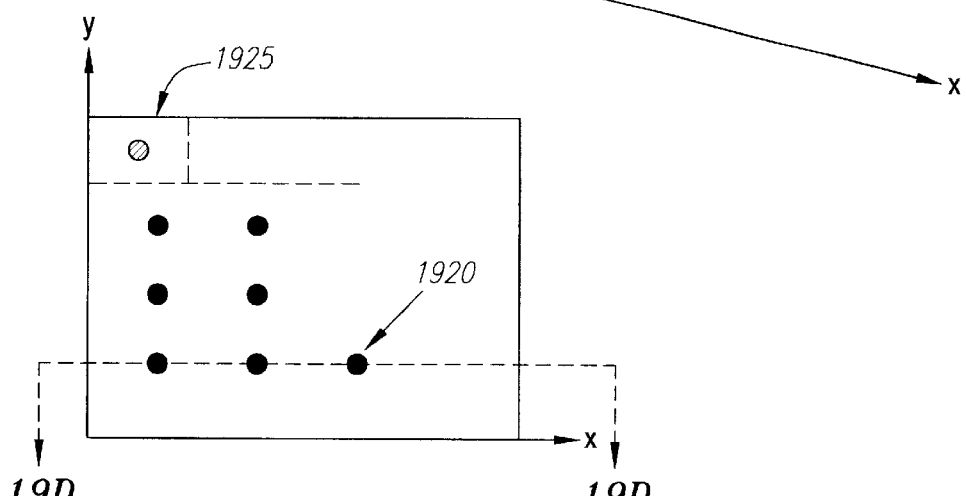
Figure 19D:
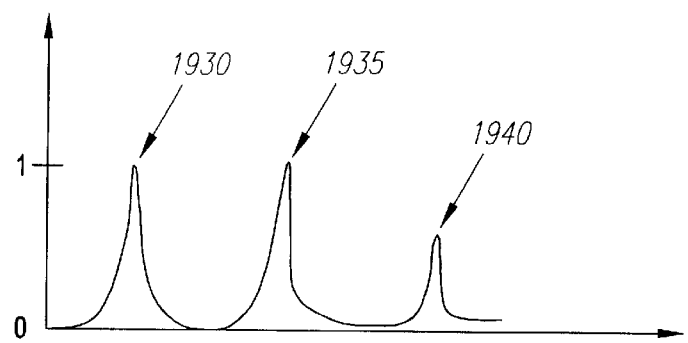
Figure 19E:
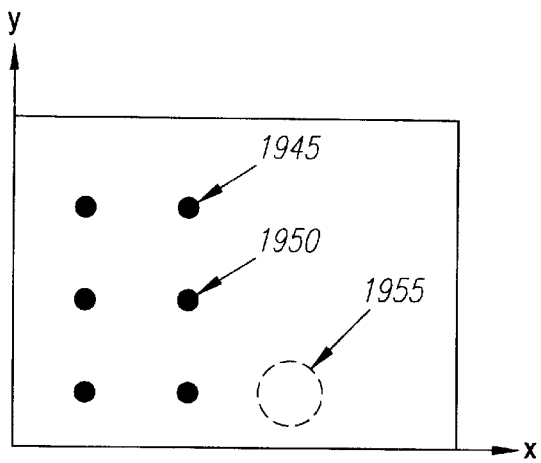

FIGS. 19A–19G illustrate feature extraction by model matching in a manner consistent with the present invention. In FIG. 19A, a gray-scale image 1900 contains a field of contact features such as features 1905. A feature is selected as a model, such as feature 1910. In FIG. 18B, a three-dimensional view of the image at 1915 shows the field of features with their pixel intensities represented in the third dimension. FIG. 19C shows a field of features including an incomplete-contact feature 1920, with a model feature 1925 overlaid for correlation. FIG. 19D is a view of the image of FIG. 19C taken along line 19D—19D, showing correlation of each feature with the model feature 1925. Correlation peaks 1930 and 1935 show a correlation of >0.9. Correlation peak 1940 shows only a partial correlation between model feature 1925 and incomplete-contact feature 1920. FIG. 19E is an image showing the center points of features with greater than 0.9 correlation to model feature 1925, such as features 1945 and 1950. The area marked with a dashed line 1955 corresponds to the location of partial-contact feature 1920 but feature 1920 is not represented in FIG. 19E because its correlation with model feature 1925 is less than 0.9 and is thus identified as a likely defect.

Figure 19F:
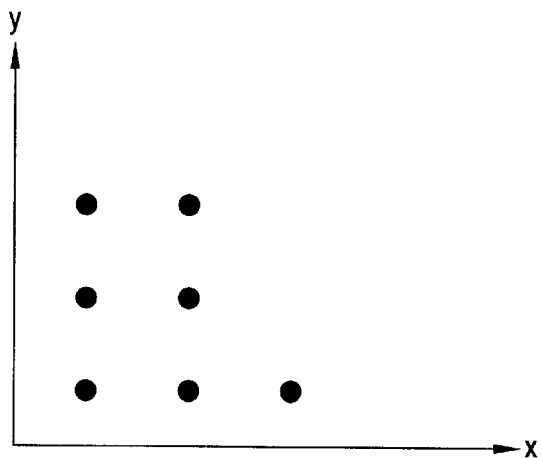
Figure 19G:
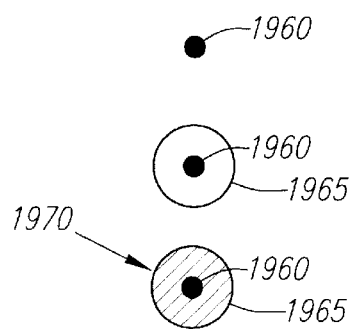

FIG. 19F represents the edges of the features of FIG. 19E, such as after applying differentiation or other edge-enhancement technique to reveal feature edges. For example, and image differentiation (or edge enhancement) filter can be used to highlight edges in the image. Features can then be extracted by determining the local maximums and minimum from the differentiated image. Boundaries enclosed by these maxima and minima contours are the boundaries of the feature of interest and can be used to construct the feature list. FIG. 19G shows a process for extraction of features from the original image, e.g., the image of FIG. 19A, using the center-point information of FIG. 19E and the feature-edge information of FIG. 19F. Knowing the center point 1960 and the edge 1965 of a feature, a grouping of pixels 1970 from the image of FIG. 19A which lie within the boundary of edge 1965 and centered at point 1960 are taken as defining the feature. The extraction process of FIG. 19G is repeated for each detected feature to prepare a table or list of features for comparison. The list can be substantially as shown, for example, in FIG. 18H.

Techniques described herein have been found suitable for automating detection of defects in fields of tungsten-filled vias in a 0.25 $\mu$m-process on a semiconductor wafer. As the pattern is repetitive, the human eye can quite easily pick out missing and partial vias. Automation with a pixel-subtraction technique on such an image leads to a noisy difference image due to subtle and insignificant differences between the background and the edges of the contacts, and results in reporting of a large number of nuisance defects. The nuisance defect rate is typically so high that nearly 100% of the images must be reviewed by human operators, making the automatic defect detection process virtually ineffective using prior-art pixel-based differencing. In contrast, feature-based detection techniques consistent with the present invention have-been found to identify missing and partial feedthroughs such as vias and contacts without human intervention with little or no reporting of nuisance defects.

Computer program listings are provided on a compact disc submitted with this document, and are incorporated by reference in their entirety. These computer program listings are subdivided into Appendices A–G. These appendices provide additional implementation details of feature-based defect detection consistent with the present invention. Appendix A is a flow listing of an algorithm. Appendix B is a pseudo-code listing useful in detecting defective contacts and vias. Some blocks of Appendices A and B can be implemented or executed in parallel, or in reverse order, without changing the result. Appendices C, D, E, F and G are software code written in C++ useful for implementing a feature-based defect detection system consistent with the present invention. Appendix C is a main program segment for processing contacts and performing alignment, and calls the code segments of Appendices D, E, F and G. Appendix D is a code segment for loading an image from disk and smoothing it by convolution with a Gaussian kernel to reduce noise. Appendix E is a code segment implementing an image alignment algorithm. Appendix F is a code segment for implementing a correlation routine for the image-alignment algorithm of Appendix E. The code segment of Appendix F could be substituted, for example, with a routine such as the PATMAX® brand software available commercially from Cognex Corporation. Appendix G is an example of a code segment for feature extraction and matching consistent with the present invention.

Terms as used herein are intended to have the following meanings:

Patterned substrate: a semiconductor wafer or photolithography mask. While exemplary descriptions are given with reference to patterned semiconductor wafers, the techniques described can also be applied to features on an image of a photolithography mask acquired with the appropriate imaging technology, such as an electron-beam imaging system with appropriate charging control.

Patterned: bearing a pattern. The pattern can represent anything, including but not limited to initial well-diffusion structures, contacts, vias, polysilicon gate structures, local interconnects, metal (Aluminum or Copper) interconnect, power planes, bond pads and combinations of these. The pattern can also represent features such as dual damascene trenches in oxide or other dielectric materials. Patterns can also represent photo-resist, such as in a standard or topographic SEM image.

Image: An array of pixels or pixel data representing an object. The array can be, but is not limited to, a two-dimensional array with pixels of uniform size and spacing and with the pixel size smaller than the features being imaged, e.g., 2–5 pixels across a feature. An image may have non-uniform pixel spacing, e.g., with pixel spacing in one direction being many times the pixel spacing in the orthogonal direction, such as the line scans described in co-pending U.S. patent application Ser. No. 09/012,277, or segments of line scans. Images may also be three-dimensional, such as tomographic images.

Voltage Contrast Image: An image in which the intensity signal (e.g., pixel intensity) is a function of the voltage or electrical potential on the surface of object being imaged, e.g., a patterned semiconductor wafer or patterned photolithography mask. The function is ideally linear, but in general is non-linear. The function is typically, but is not necessarily, monotonic.

Reference Image: An image used for comparison with a test image. A reference image can be an image of another die or cell or block, either on the same wafer or a different wafer. It can be of a die or cell or block of known quality, e.g., a "golden" die or cell or block, or of unknown quality, e.g., if an image of a third die or cell or block is to be used for arbitration. It can be at the same or similar magnification as the test image to which it is to be compared, or at any magnification. It can be a voltage-contrast image or another kind of image such as a focused-ion-beam (FIB) image, atomic-force-microscope (AFM) image, a topographic scanning-electron-microscope (SEM) image or an image prepared from a computer-aided-design (CAD) database. A reference image may alternatively be a data structure containing a list of features and their corresponding properties (location, size, shape, intensity, grounded or floating and other properties like connectivity).

Test Image: An image acquired from a physical sample to be inspected, such as a patterned semiconductor wafer or patterned photolithography mask, for comparison with a reference image. A test image can be an image of a die or cell or block. It can be a voltage-contrast image or another kind of image such as a focused-ion-beam (FIB) image, atomic-force-microscope (AFM) image or a topographic scanning-electron-microscope (SEM) image.

Extract Features: Convert an image (an array of pixels or pixel data) into a list of features represented as a data structure, such as a linked list. Artifacts of the physical object being inspected, which are represented as collections of neighboring pixels in the image, are represented after extraction by properties of the artifact. Features can be, for example, contacts or contact holes or conductors and/or other physical structures of a patterned semiconductor wafer. Properties may be, but are not limited to, measures such as diameter, area, intensity and position of the feature represented in the image, and other measures known in the field of blob analysis. A non-limiting list of examples of properties which can be calculated is given in the Matrox Imaging Library Command Reference Version 3.1, Manual No. 10368-MS-0310, Matrox Electronic Systems Ltd. Extraction may employ thresholding or non-thresholding techniques.

Match Features: Processing or pairing of features extracted from test and reference images. The features are stored or represented as data structures, e.g. linked lists, that do not necessarily list the features in the same order in the list for the test image as in the list for the reference image. (Feature extraction order may vary depending on a variety of factors, including the relative stage position error.) Features of the test and reference images thus cannot be matched by overlaying the data structure. Matching is therefore based on the physical location (e.g. x, y coordinate location) of the feature, corrected as needed for image alignment offset (e.g., using the result of an image alignment algorithm). Matching takes into account features which are missing in an image, whether because they are outside the field of view (e.g., due to stage errors) or due to wafer processing errors (i.e., defects).

Compare Features to Identify Defects: After features are extracted, calculating one or many properties of the features in an computational process and comparing values of the calculated properties. Properties can include (but are not limited to) size, shape, average intensity (which is particularly valuable for noise reduction in shot noise limited e-beam images), center of gravity, diameter, area, and standard deviation. One or multiple properties in combination can be compared, and a defect reported if the feature properties differ by a predetermined amount. The comparison can be a numerical operation such as a subtraction, a ratio, a greater than or less than function, or other mathematical comparison. Combining properties can increase the sensitivity of defect detection without increasing the nuisance defect rate, e.g., the sum of all pixels in a feature combines a measure of area and average intensity and is particularly good for detecting a defect that results in a subtle gray level change but that also (as is the case for contacts or vias) changes the apparent size of the feature. Another approach is to calculate statistics (such as mean, standard deviation, and/or linear regression) on the differences between properties. Features whose differences are greater than, e.g., two standard deviations of the distribution of differences, are reported as defects. Such an adaptive threshold avoids setting a fixed limit so the threshold is adaptive within a desired range of statistical significance. The mean and standard deviations of feature differences are themselves measures of defect density. If linear regression is used, then statistical deviations from the regression line can also be used to measure defect density.

Background level (background removal): Some voltage-contrast images do not have uniform contrast. The non-uniformity can result in false defects if simple pixel-subtraction algorithms are used without removing (that is, subtracting or normalizing) the background level. Features of a semiconductor wafer are typically conductors—such as wires, vias or contacts—and the area surrounding these features is typically dielectric, such as $SiO_2$. The background is the area of the image between features, representing dielectric. Non-uniformity-charging artifacts sometime result in slightly different surface potential and thus a background intensity level that varies across the image. Removing or normalizing the background level improves the robustness of feature extraction.

Feature template: A feature (e.g., a contact) used to aid in feature extraction. For example, matched-filter theory can be used to extract features of a particular type from an image by applying a filter whose impulse response is the same as or similar to the feature type to be extracted. Features are identified where there is strong correlation, or a maximum by differentiation in the correlation response, between a feature of the image and the feature template. Having thus identified a feature as correlating with the feature template, its size can be extracted using thresholding or by calculating the second differential and using the gradient maximums to determine size. For example, an image of a contact is correlated with an image containing many contacts. The contacts are identified as such due to their high correlation with the feature template.

Arbitration: Comparison can be performed between a reference image and a test image as discussed above. The reference image may be of a die with a lower probability of defects than the test image, e.g., a die near the center of a wafer is used as a reference image because it has a lower probability of defects than a die near the edge of a wafer. The test die will be in an area that is more likely to have defects. However, it is still possible for the reference die to have defects. In general it is not possible to determine unambiguously which image is defective, and a third image may be required for arbitration. Arbitration may be combined with the defect detection process or performed as a post process. Once a defect is detected by comparison between a reference image and a test image, arbitration is performed by comparison with a third image (or a third cell in the case of cell-to-cell comparison in array mode) to determine whether the reference image or the test image has the defect. In array mode, features are extracted and compared to the corresponding features in neighboring cells of the same image. Arbitration is not required when the reference image is generated from a CAD database, for example.

An example of array mode operation is illustrated in FIGS. 23A–23D and FIG. 24.

Figure 23A:
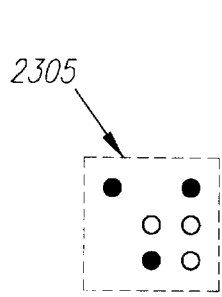
FIGS. 23A–23D illustrate an example of an array mode operation.
Figure 23B:
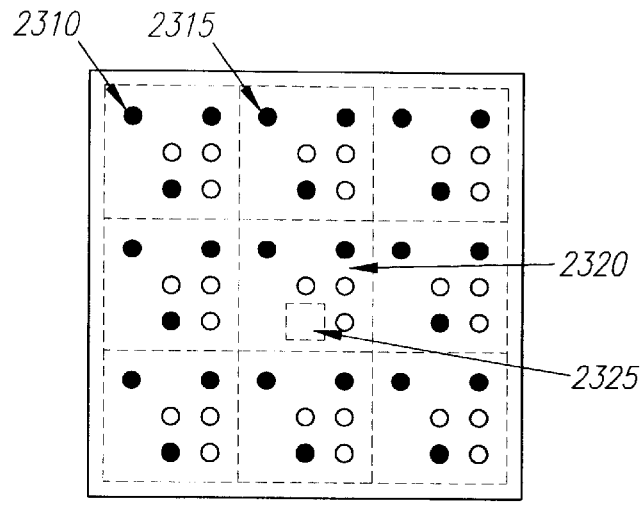
Figure 23C:
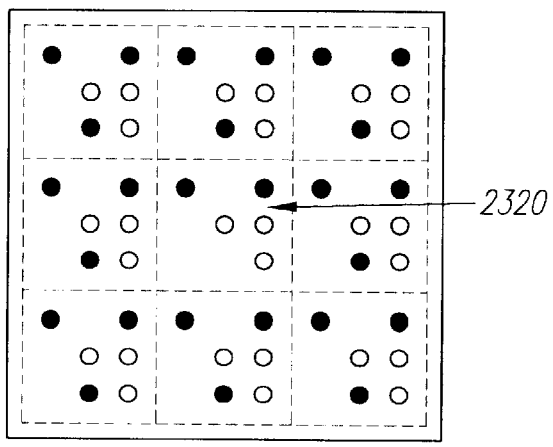
Figure 23D:
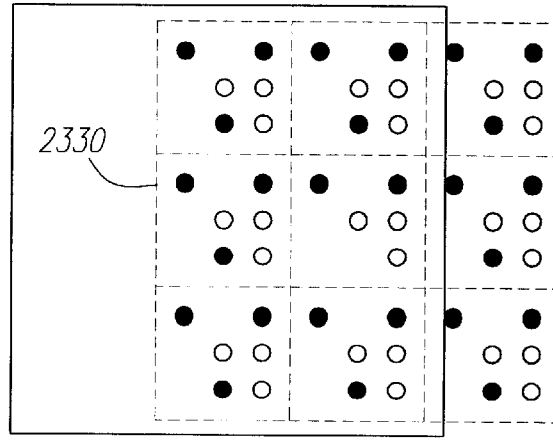

Array mode operation takes advantage of the repetitive nature of structures such as memory cells. In array mode, a repetitive structure such as a memory cell is compared to its neighbor to find defects. In the example of FIGS. 23A–23D, the test image can be a nearby cell such as an adjacent cell. Array mode operation can be implemented in a number of ways, such as by shifting the image by one cell or by using a feature matching routine that matches features based on cell repetition as in the flow diagram of FIG. 24. FIG. 23A shows an example of a repeating cell 2305 having a plurality of features such as contacts and contact holes. FIG. 23B shows an image in which the cell of FIG. 23A should be repeated without error. Like features from neighboring cells such as cells 2310 and 2315 can be compared to identify defects. Cell 2320 is missing a contact, as indicated at 2325, which should be detected as a defect. FIG. 23C shows the image of repeating cell patterns of FIG. 23B, with missing contact at cell 2320. FIG. 23D shows the same image, shifted one cell to the right to facilitate comparison of cell 2330 with cell 2320.

Figure 24:
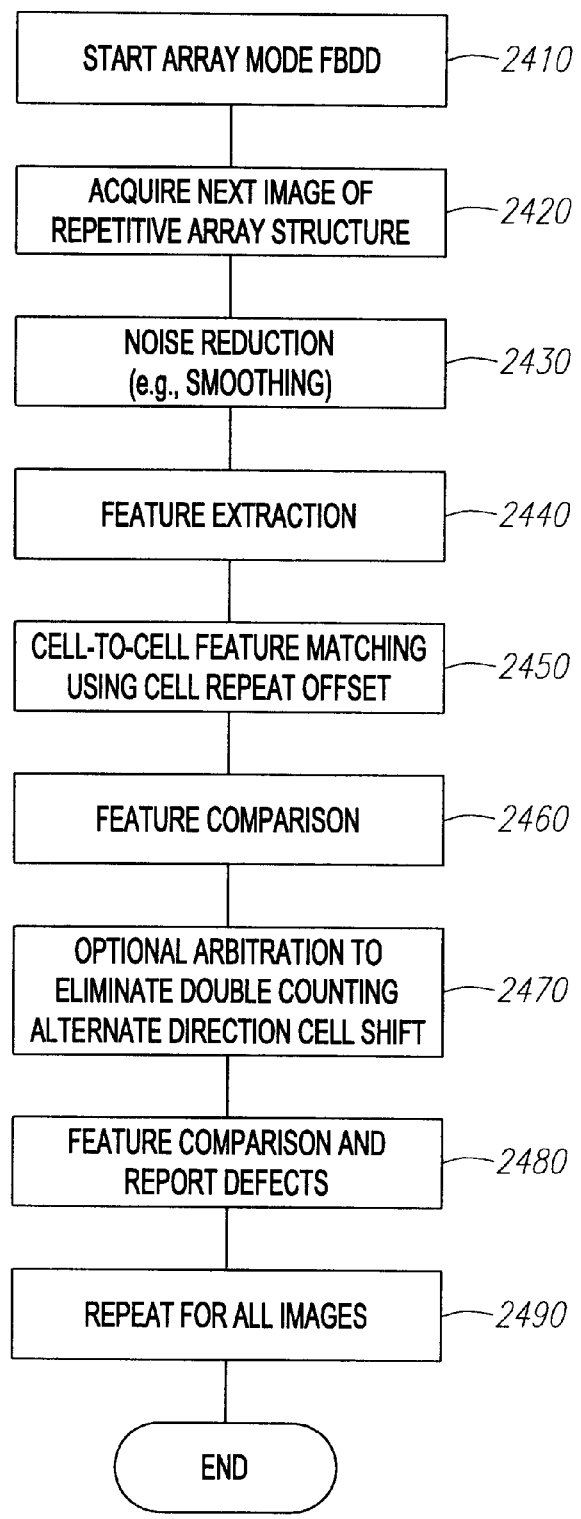
FIG. 24 shows a flow diagram of an array mode method for performing cell-to-cell comparision for defect detection.

FIG. 24 is a flow diagram of an array-mode method for performing cell-to-cell comparison for defect detection. In array mode, double defect counting occurs because each cell is involved in two comparisons—in effect, one to the left and on to the right. In one comparison, a particle defect, for example, will appear as an extra feature and in the next comparison as a missing feature—both can be erroneously reported as defects if arbitration (described above) is not used to identity which cell has the real defect. The method starts at step 2410. At step 2420 an image of the repetitive array structure is acquired (or retrieved from memory or other storage if already acquired). At step 2430 the acquired/retrieved image is noise-reduced, e.g., by smoothing. At step 2440, features are extracted from the image. At step 2450, cell-to-cell feature matching is performed using cell repeat offset. At step 2460, the matched features are compared. At step 2470, arbitration is optionally performed to eliminate double defect counting from the effective alternate direction cell shift. At step 2480, features are compared and defects reported. Step 2490 returns control to step 2420 to repeat the process for additional images. The method ends when processing of all images is complete.

Electron-beam imaging systems such as the system of FIG. 2 are controlled by a processor having a data store. Methods consistent with the present invention can be carried out through execution by the processor of application code (computer-readable instructions) embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves. Comparison functions described herein can be carried out in the processor of an electron-beam imaging system or in other computer systems as desired. The systems described above are for purposes of example only. An embodiment consistent with the invention may be implemented in a charged-particle-beam system having any type of computer system or programming or processing environment.

Methods of extracting features from images are not limited to the examples described herein. Any suitable methods known in the art may be used as appropriate. Techniques for extraction, analysis and recognition of image features (also sometimes referred to in the art as "blobs") useful in implementing methods and apparatus consistent with the present invention are well-known, and libraries of computer instructions for implementing such techniques are commercially available. An example of such a library is the "MATROX® Imaging Library" (e.g., Version 3.1) available from Matrox Electronic Systems Ltd. and having functionality as described in the MATROX® "Command Reference" Manual No. 10368-MS-0310.

In general, feature extraction is used to identify and locate any and all occurrences of a specified feature in an image. An image is scanned and only the patterns in the image that are similar to the specified feature are extracted. This allows the image to be separated into two types of regions: feature and non-feature. Only the feature regions need to be processed and analyzed for defects. Also, feature properties or properties, such as area, size, location, etc., can be calculated analyzed and compared to find defects. There are many image processing techniques that can be used to identify features in a voltage contrast image, such as simple image thresholding, adaptive image thresholding, image model matching, synthetic model matching, and edge enhancement such as differentiation. In general, features extraction techniques are based on thresholding of pixel intensity values, detection of feature edges, or combinations of thresholding and edge detection.

In simple image thresholding, the grayscale intensity of the image is used to segment the image into features and non-features. Regions of the image that have the same intensity, or are in the same range of intensities, are grouped together into "blobs." Each blob then is taken to represent a feature extracted from the image. Everything else in the image is considered "background" or non-feature. Once the feature is extracted, properties of the feature can be calculated, such as location, area, average intensity, sum of intensity, etc. These properties can be used to characterize the feature and can be compared to the properties of other extracted features.

There is a trade-off between stage-positioning accuracy and image alignment. To accurately match features between test, reference and arbitration (if used) images, the images must in general be aligned sufficiently accurately that when the images are overlaid the alignment error between the images is less (preferably substantially less) than half the distance between features in the image. If this is not the case then the features cannot be reliably paired and some mismatching is likely to occur resulting in false (i.e. defect detection system induced errors) defect reporting. Feature-based alignment techniques as described herein in principle relax this alignment constraint but may be nonetheless limited by inherent pattern repetition in IC interconnect patterns. Required alignment accuracy for feature-based alignment consistent with the invention is however less stringent than for pixel-based differencing, where the maximum acceptable alignment error is typically substantially less (<20%) than the feature size in the images and is preferably less than a single pixel.

Two practical solutions to the alignment problem can be used: an accurate stage combined with pre-alignment of the imaged area, or a lower-cost and less accurate stage with image processing algorithms to correct for the stage errors. Accurate vacuum-chamber stages using laser interferometers for position feedback are well-known and are commercially available from suppliers such as Anorad Corporation of Long Island, N.Y. Image processing software with image alignment routines is also available from multiple sources, though in practice some of these algorithms produce an unacceptable misalignment rate when the images are offset by a large amount (>10% of the FOV) or if the features are partially repeating. Cognex Corporation is a leading supplier of pattern recognition and alignment software such as the PATMAX® brand software which is believed to be robust and reliable. Nevertheless there will be some residual alignment error rate, typically <1%. While the image alignment algorithm-based approach is lower cost than the precision stage solution, it imposes computational overhead from the alignment algorithms. In one experimental implementation using a stage with accuracy of ~1–2 $\mu$m in combination with alignment routines, the alignment error rate was found to be approximately 3%. It is believed that this can be improved with the use of the Cognex PATMAX® brand software.

Those of skill in the art will recognize that these and other modifications can be made within the spirit and scope of the invention as defined in the claims.

What is claimed is:

1. A method of inspecting a patterned substrate, comprising:

preparing a reference image and a test image of at least a portion of the patterned substrate;

extracting features from the reference image and extracting features from the test image;

matching features of the reference image and features of the test image; and comparing features of the reference image and of the test image to identify defects;

wherein comparing features of the reference image and of the test image to identify defects comprises:

computing feature properties in the reference image; computing feature properties in the test image; and comparing the computed feature properties in the test image with the computed feature properties in the reference image;

wherein the computed feature properties comprise: area, size, center of gravity, average intensity, sum of intensity, and standard deviation of intensity;

wherein comparing the computed feature properties comprises:

calculating feature properties comparison statistics that include one or more of differences, ratios, greater-than or less-than functions, means, standard deviations, linear regressions, and adaptive thresholds; and determining whether the feature properties comparison statistics meet predetermined defect criteria.

2. The method of claim 1, further comprising the step of aligning the test image with the reference image prior to matching features of the reference image and features of the test image.

3. The method of claim 1, further comprising the step of recording defects identified when comparing features of the reference image and of the test image.

4. The method of claim 1, wherein the reference image is a voltage-contrast image of a first patterned substrate and the test image is a voltage-contrast image of a second substrate.

5. The method of claim 1, wherein the reference image is a voltage-contrast image of a first region of a patterned substrate and the test image is a voltage-contrast image of a second region of the same patterned substrate.

6. The method of claim 5, wherein the reference image is an image of repeating cells of a patterned substrate and the test image is a duplicate of the reference image shifted by one cell relative to the reference image.

7. The method of claim 1, wherein preparing the reference image and test image comprises smoothing the reference image and smoothing the test image.

8. The method of claim 1, wherein preparing the reference image and test image comprises normalizing the reference image and normalizing the test image.

9. The method of claim 1, wherein preparing the reference image and test image comprises storing a reference image and storing a test image.

10. The method of claim 1, wherein extracting features comprises extracting features from the reference image and thereafter extracting features from the test image.

11. The method of claim 1, wherein preparing a reference image and a test image and extracting features from the images comprise: storing a reference image and extracting features from the reference image, and storing a test image and extracting features from the test image.

12. The method of claim 1, further comprising reporting defect property statistics.

13. The method of claim 1:
wherein the reference image and the test image comprise pixel data having location and intensity information;
wherein the extracting comprises:
thresholding the intensity information of the test image to produce a binary-level image having feature regions and non-feature regions, and
using the binary-level image as a mask to define those regions of the test image as features which correspond to the feature regions of the binary-level image.

14. The method of claim 13, wherein
extracting features from the reference image comprises:
computing an average background level of the reference image, removing the average background level from the reference image to produce a first modified reference image,
thresholding the first modified reference image to produce a second modified reference image, and
identifying features in the second modified reference image;
the matching comprises matching features of the second modified reference image and features of the test image; and
the comparing comprises comparing features of the second modified reference image and of the test image to identify defects.

15. The method of claim 13, wherein
extracting features from the test image comprises
computing an average background level of the test image,
removing the average background level from the test image to produce a first modified test image,
thresholding the first modified test image to produce a second modified test image, and
identifying features in the second modified test image;
the matching comprises matching features of the reference image and features of the second modified test image; and
the comparing comprises comparing features of the reference image and of the second modified test image to identify defects.

16. The method of claim 13, wherein extracting features from the reference image comprises:
computing an average background level of the reference image,
removing the average background level from the reference image to produce a first modified reference image,
matching a feature template in the first modified reference image, and
identifying features in the first modified reference image that match the feature template.

17. The method of claim 13, wherein extracting features from the test image comprises:
computing an average background level of the test image,
removing the average background level from the test image to produce a first modified test image,
matching a feature template the first modified test image, and identifying features in the first modified test image that match the feature template.

18. The method of claim 1 wherein:
wherein the extracting comprises:
repetitively comparing the test image with a model feature to produce correlation data representing correlation features of the test image with the model feature,
thresholding the correlation data to identify feature locations within the test image, and
detecting edges of features at the identified feature locations.

19. Apparatus for inspecting a patterned substrate that comprises:
a computer system; and
instructions for controlling the computer system:
to prepare a reference image and a test image of at least a portion of the patterned substrate;
to extract features from the reference image and extract features from the test image;
to match features of the reference image and features of the test image; and
to compare features of the reference image and of the test image to identify defects;
wherein comparing features of the reference image and of the test image to identify defects comprises:
computing feature properties in the reference image; computing feature properties in the test image; and comparing the computed feature properties in the test image with the computed feature properties in the reference image;
wherein the computed feature properties comprise: area, size, center of gravity, average intensity, sum of intensity, and standard deviation of intensity;
wherein comparing the computed feature properties comprises:
calculating feature properties comparison statistics that include one or more of differences, ratios, greater-than or less-than functions, means, standard deviations, linear regressions, and adaptive thresholds; and
determining whether the feature properties comparison statistics meet predetermined defect criteria.

20. The apparatus of claim 19, wherein the instructions control the computer system to align the test image with the reference image prior to matching features of the reference image and features of the test image.

21. The apparatus of claim 19, wherein the instructions control the computer system to record defects identified when comparing features of the reference image and of the test image.

22. The apparatus of claim 19, further comprising an electron-beam imaging subsystem for acquiring voltage-contrast images of a patterned substrate for use as test images.

23. The apparatus of claim 19, wherein the instructions control the computer system to smooth at least one of the reference image and the test image.

24. The apparatus of claim 19, wherein the instructions control the computer system to normalize at least one of the reference image and the test image.

25. The apparatus of claim 19, wherein the instructions control the computer system to first extract features from the reference image and then extract features from the test image.

* * * * *